US011011510B2

(12) United States Patent
Kocon

(10) Patent No.: US 11,011,510 B2
(45) Date of Patent: May 18, 2021

(54) BREAKDOWN UNIFORMITY FOR ESD PROTECTION DEVICE

(71) Applicant: Texas Instruments Incorporated, Dallas, TX (US)

(72) Inventor: Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/593,251

(22) Filed: Oct. 4, 2019

(65) Prior Publication Data

US 2021/0104513 A1 Apr. 8, 2021

(51) Int. Cl.
*H01L 27/02* (2006.01)
*H01L 27/12* (2006.01)
*H01L 29/40* (2006.01)

(52) U.S. Cl.
CPC ...... *H01L 27/0262* (2013.01); *H01L 27/1203* (2013.01); *H01L 29/402* (2013.01)

(58) Field of Classification Search
CPC ............ H01L 27/0647; H01L 27/0262; H01L 29/402
See application file for complete search history.

(56) References Cited

U.S. PATENT DOCUMENTS

| 2014/0308787 | A1  |         | 10/2014 | Kocon   |                    |
|--------------|-----|---------|---------|---------|--------------------|
| 2014/0339601 | A1  | *       | 11/2014 | Salcedo | ...... H01L 29/7436 |
|              |     |         |         |         | 257/140            |
| 2020/0083212 | A1  | *       | 3/2020  | Zhao    | ...... H02H 9/045   |

* cited by examiner

*Primary Examiner* — Changhyun Yi
(74) *Attorney, Agent, or Firm* — Jacqueline J. Garner; Charles A. Brill; Frank D. Cimino

(57) ABSTRACT

An electronic device includes an ESD protection device with implanted regions that extend around a finger shape with a straight portion and elongated turn portions, and contacts that extend only in the straight portion, where the turn portions include elongated lightly doped implanted regions to mitigate turn on of a curvature PNP transistor for uniform device breakdown performance. Adjacent finger structures are spaced apart from one another to mitigate thermal transfer between device fingers.

20 Claims, 24 Drawing Sheets

US 11,011,510 B2

BREAKDOWN UNIFORMITY FOR ESD PROTECTION DEVICE

BACKGROUND

Electrostatic discharge (ESD) events can be triggered by human interaction with a circuit board or an included electronic device, such as an integrated circuit (IC), causing high voltages on one or more pads of the IC. If the IC is unprotected, the high pad voltage can lead to undesired current flow through internal circuitry, which can damage or degrade circuit components of the IC. Accordingly, many ICs include protection devices or circuits to provide discharge paths between one or more pads and a ground terminal, power terminal, or other reference node. ESD protection devices or circuits may be provided to protect power supply terminals, as well as to protect I/O terminals and other external connections that may be subjected to ESD events. Ideally, the breakdown voltage (BV) rating or triggering threshold of an ESD protection device is tailored to the voltage rating of the protected circuitry and is stable for different operating conditions of the electronic device. Early latch-up of ESD protection devices is desired as it lowers silicon temperature and enhances current conduction. ESD protection devices operate and conduct max current in latch-up in response to ESD events that meet or exceed the breakdown voltage. A high ESD current rating is desired to reduce the size and cost of an ESD protected product, but non-uniform latch-up can lead to creation of hot spots, very low ESD current rating and poor reliability. SOI ESD structures are built above an oxide-isolated substrate and are susceptible to thermal hot spots. In addition, thermal spreading is mostly limited to top surface and conventional circuit layouts do not ensure uniform latch-up or prevention of thermal spreading.

SUMMARY

An electronic device is described, having an ESD protection device with implanted regions that extend around a finger shape that includes a straight portion and elongated turn portions. Examples of the ESD protection device include contacts that extend only in the straight portion. In certain examples, the turn portions include elongated lightly doped implanted regions to mitigate turn on of a curvature PNP transistor and enhance uniform device breakdown performance. Adjacent finger structures are spaced apart from one another to mitigate thermal transfer or spreading between device fingers.

DETAILED DESCRIPTION

Figure 1:
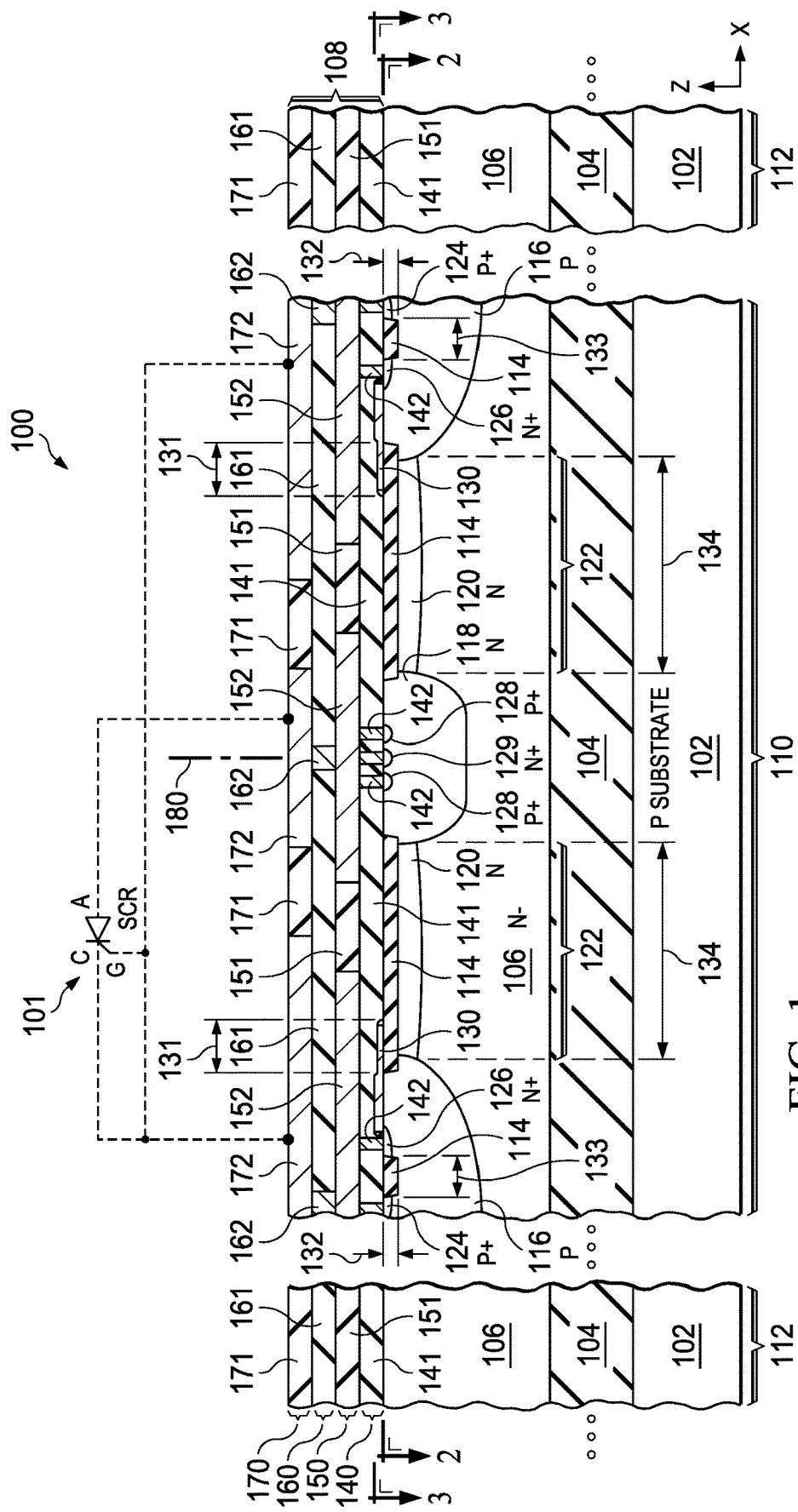
FIG. 1 is a partial sectional side elevation view of an integrated circuit (IC) electronic device with a silicon controlled rectifier (SCR) ESD protection device taken along line 1-1 in FIGS. 2 and 3.

In the drawings, like reference numerals refer to like elements throughout, and the various features are not necessarily drawn to scale. One or more operational characteristics of various circuits, systems and/or components are hereinafter described in the context of functions which in some cases result from configuration and/or interconnection of various structures when circuitry is powered and operating.

Figure 2:
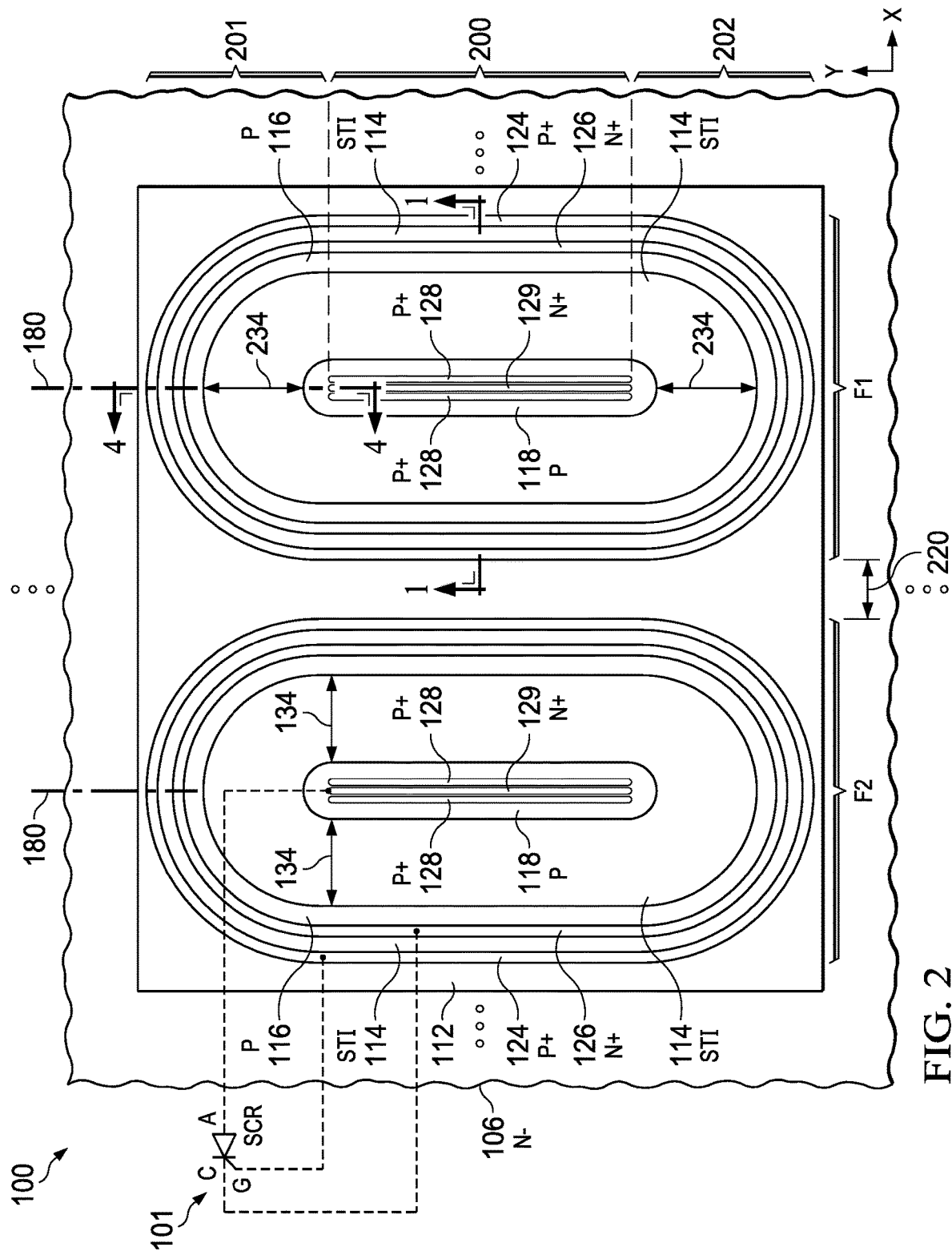
FIG. 2 is a partial sectional top plan view of the SCR ESD protection device taken along line 2-2 in FIG. 1.
Figure 3:
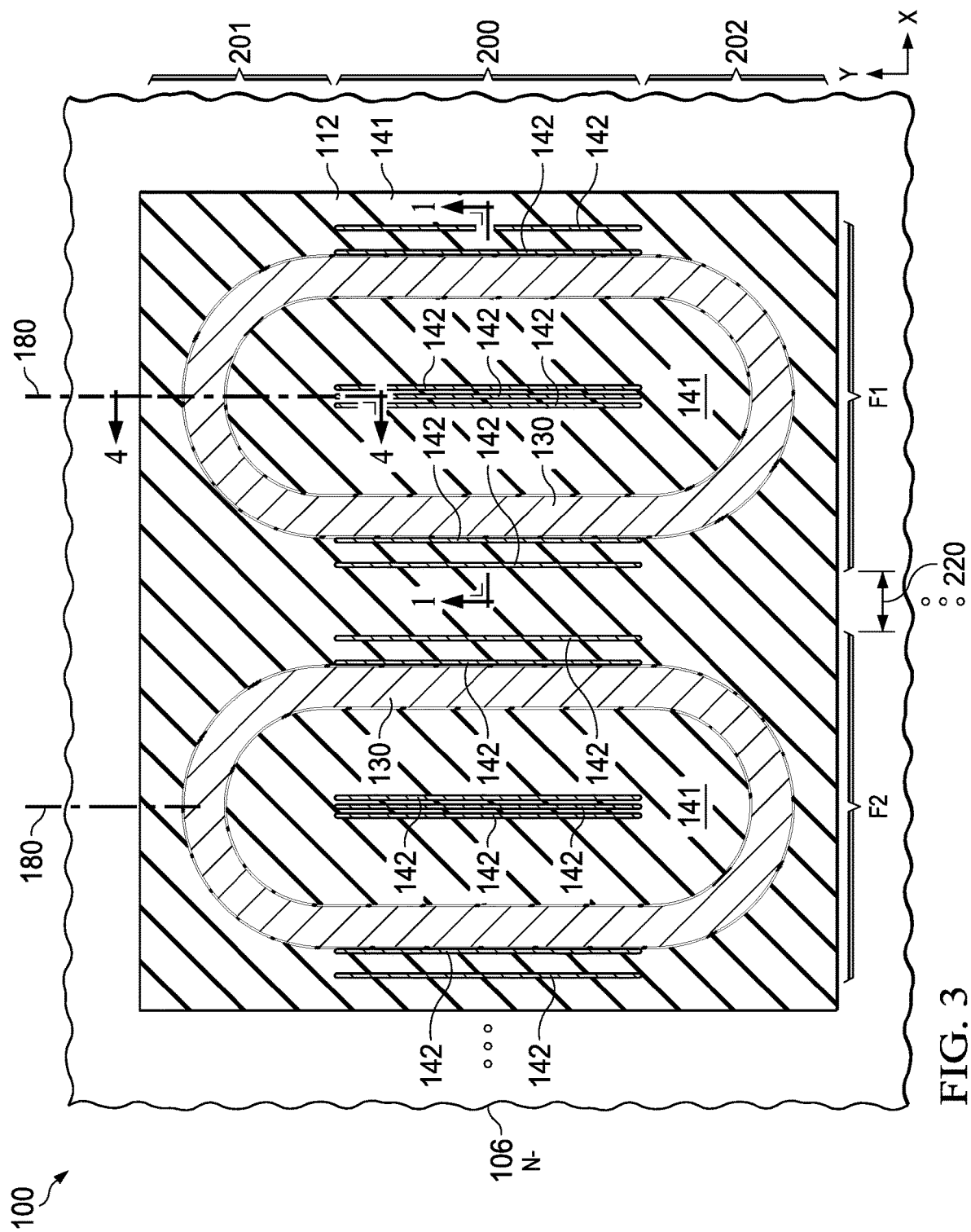
FIG. 3 is a partial sectional top plan view of the SCR ESD protection device taken along line 3-3 in FIG. 1.
Figure 4:
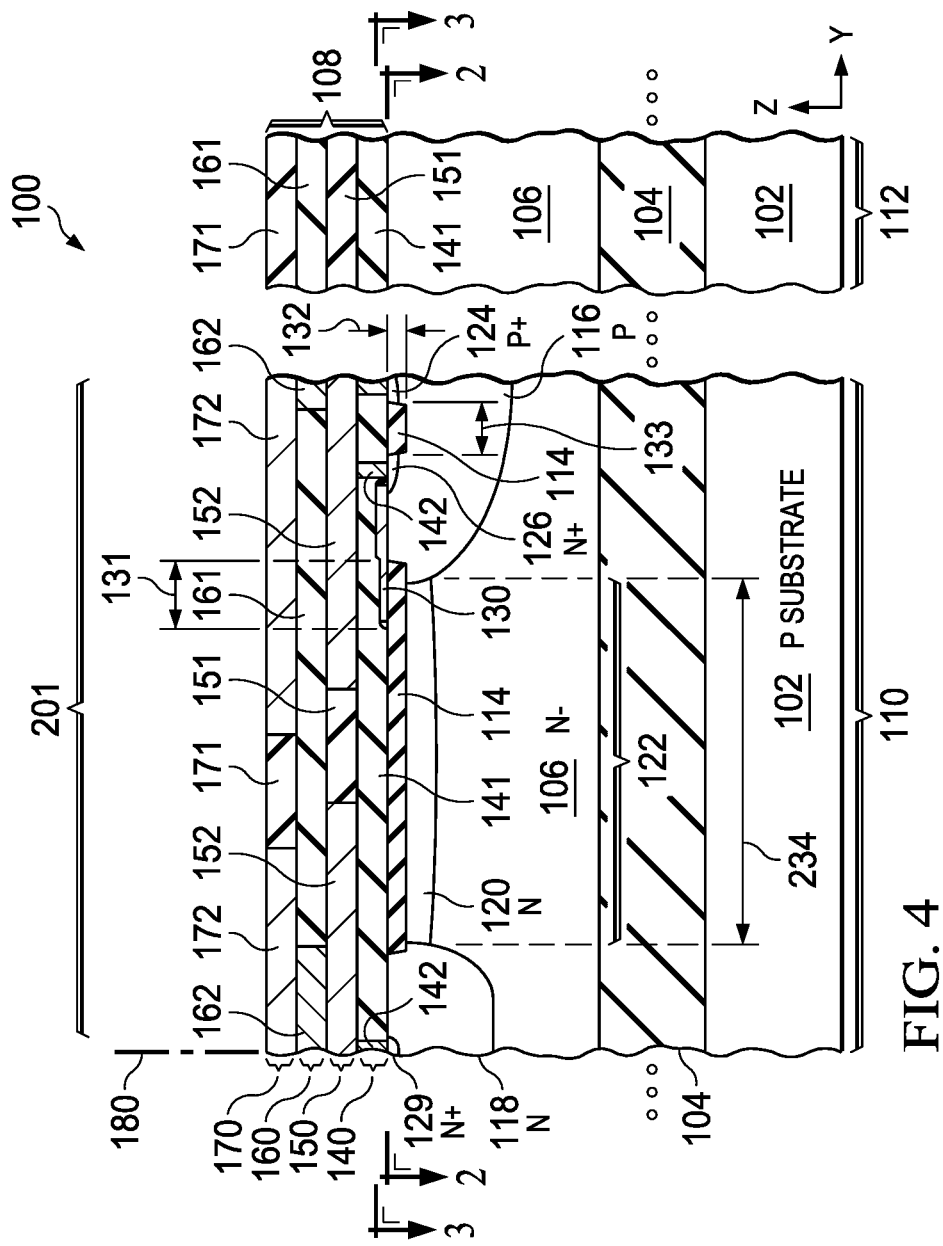
FIG. 4 is a partial sectional side elevation view of an integrated circuit (IC) electronic device with a silicon controlled rectifier (SCR) ESD protection device taken along line 4-4 in FIGS. 2 and 3.

FIGS. 1-4 show an integrated circuit (IC) electronic device 100 with an SCR type ESD protection device 101. FIG. 1 shows a sectional side view of a portion of an integrated circuit (IC) electronic device with a silicon controlled rectifier (SCR) ESD protection device taken along line 1-1 in FIGS. 2 and 3. FIG. 2 shows a sectional top view taken along line 2-2 in FIGS. 1 and 4, and FIG. 3 shows a sectional top view taken along line 3-3 in FIG. 1. FIG. 4 shows a sectional side view taken along line 4-4 in FIGS. 2 and 3. The electronic device 100 provides finger shapes (e.g., racetrack shapes) in single or multi-finger ESD protection device examples 101 with implanted regions that extend around the finger shape that includes a straight portion and elongated turn portions. Examples of the ESD protection device 101 include contacts that extend only in the straight portion. In certain examples, the turn portions do not include contacts, but include elongated lightly doped implanted regions to mitigate turn on of a curvature PNP transistor and to enhance uniform device breakdown performance. Multi-finger examples include adjacent finger structures that are spaced apart from one another by a non-zero distance to mitigate thermal spreading between device fingers and to enhance device current carrying capability and reliability.

FIGS. 1 and 2 schematically show the SCR-type ESD protection device 101, which includes an anode labeled "A", a cathode labeled "C", and a gate labeled "G". As shown in FIGS. 1 and 4, the electronic device 100 includes an SOI structure with a semiconductor substrate 102 (e.g., silicon) having a first (e.g., bottom) side and an opposite second (e.g., top) side. In one example, the semiconductor substrate 102 is doped with n-type dopants, such as phosphorus (e.g., labeled "N+" in FIG. 1). The SOI structure also includes an insulator layer 104, such as silicon dioxide ($SiO_2$) with opposite first and second (e.g., bottom and top) sides, where the bottom or first side of the insulator layer 104 is disposed along the top or second side of the semiconductor substrate 102. In addition, the SOI structure includes an upper semiconductor layer 106 (e.g., silicon), with opposite first and second (e.g., bottom and top) sides. The first side of the semiconductor layer 106 is disposed along the second side of the insulator layer 104. The resulting SOI structure includes two semiconductor layers 102 and 106 separated by the insulator layer 104. The lower semiconductor substrate 102 can be used as a handle during manufacturing and can be referred to as a handle substrate.

The electronic device 100 includes a multi-layer metallization structure 108 that extends over or above the upper second side of the semiconductor layer 106, as shown in FIG. 1. The SCR ESD protection device 101 in this example is fabricated on and/or in the upper semiconductor layer 106 in an active region 110 of the electronic device 100. The active region 110 in one example is laterally surrounded on four sides by an isolation region 112, although not a requirement of all possible implementations. The ESD protection device 101 also includes one or more isolation layers, including various shallow trench isolation (STI) structures with an isolation layer 114 formed in a corresponding trench in the upper second side of the semiconductor layer 106.

The ESD protection device 101 in FIGS. 1 and 2 is fabricated on and/or in the upper semiconductor layer 106 and includes a first implanted region 116 and a second implanted region 118 disposed in the semiconductor layer 106. The first implanted region 116 is disposed along a first portion of the upper second side of the semiconductor layer 106 and includes majority carrier dopants of a first type (e.g., P, such as boron). The second implanted region 118 is disposed along a second portion of the second side of the semiconductor layer 106 and is laterally spaced apart from the first implanted region 116 along a first direction (e.g., the "X" direction in FIGS. 1 and 2). In particular, the second implanted region 118 in this example is spaced apart from the first implanted region 116 along the first direction X by a first distance 134 in the section view shown in FIG. 1, and is apart from the first implanted region 116 by a greater distance in turn portions of a finger shape, as illustrated and described further below in connection with FIGS. 2 and 3. The second implanted region 118 includes majority carrier dopants of a different second type (e.g., N, such as phosphorus). The ESD protection device 101 has a finger or "racetrack" shape, as shown in FIG. 2, where the second implanted region 118 is located at a center 180, and the first implanted region 116 laterally surrounds the center position. A single finger shape can be used in certain implementations. The example of FIGS. 1-4 includes more than one finger shape (e.g., finger shapes F1 and F2 shown in the top views of FIGS. 2 and 3). The finger shapes F1 and F2 in this example are formed generally parallel and spaced from one another along the first direction X.

The ESD protection device 101 in FIG. 1 also includes a third implanted region 120 disposed along a third portion of the upper second side of the semiconductor layer 106. The third implanted region 120 extends along the first direction X from the first implanted region 116 to the second implanted region 118. The third implanted region 120 includes majority carrier dopants of the second type N. In one example, the electronic device 100 is an integrated circuit with other electronic components fabricated on and/or in other regions of the SOI structure (not shown), including field effect transistors (FETs) with implanted source and drain regions. In this example, the FET source and drain features are concurrently formed with the corresponding ones of the respective first and second implanted regions 116 and 118 of the SCR ESD protection device 101. In this example, moreover, the FET devices may include lightly doped drain (LDD) implanted regions that are concurrently implanted with the third implanted region 120 of the SCR ESD protection device 101.

In one example, the LDD regions and the third implanted region 120 includes n-type majority carrier dopants (e.g., phosphorus) at a dopant concentration of $5 \times 10^{15}$ cm$^{-3}$ to $1 \times 10^{17}$ cm$^{-3}$ at or near the top of the region 120 beneath the STI isolation layer 114 to provide a drift region 122 between the respective first and second implanted regions 116 and 118. In one example, for a breakdown voltage rating of 100 V or more for the SCR ESD protection device 101, the n-type carrier concentration of the third implanted region 120 is about $2 \times 10^{16}$ cm$^{-3}$ at or near the top of the region 120 beneath the STI isolation layer 114. In certain implementations, increasing the dopant concentration can accommodate increased field plate/isolation layer overlap distances to facilitate reduced breakdown voltage variation for an ESD protection device 101. In one example, the third implanted region 120 has an implanted depth below the STI isolation layer 114 along a second direction (e.g., downward along the "Z" direction in FIG. 1) from 3 µm to 16 µm, such as 6-7 µm, for a 100 V breakdown voltage rating of the ESD protection device 101. The first and second directions X and Z are orthogonal to one another and are both orthogonal to a third direction "Y" shown in FIG. 2.

The SCR ESD protection device 101 in FIG. 1 includes a first isolation layer 114 that extends in a corresponding trench in the second side of the semiconductor layer 106 along the first direction X from a portion of the first implanted region 116 inward over the third implanted region 120 to a portion of the second implanted region 118.

The SCR ESD protection device 101 in this example forms an N-P-N-P structure to provide terminals of the SCR, including implanted portions 124 and 126 of the first implanted region 116 and implanted portions 128 and 129 of the second implanted region 118. The SCR cathode C includes a first implanted portion 126 of the first implanted region 116. The first implanted portion 126 of the first implanted region 116 includes majority carrier dopants of the second type N at a dopant concentration greater than a dopant concentration of a remainder of the first implanted region 116 (e.g., labeled "N+" in FIG. 1). The SCR gate G includes a second implanted portion 124 of the first implanted region 116. The second implanted portion 124 includes majority carrier dopants of the first type P at a dopant concentration greater than the dopant concentration of the remainder of the first implanted region 116 (e.g., labeled "P+").

The SCR anode A includes the implanted portion 128 of the second implanted region 118. The implanted portion 128 includes majority carrier dopants of the first type P at a dopant concentration greater than a dopant concentration of a remainder of the second implanted region 118 (e.g., labeled "P+"). The implanted portion 129 of the second implanted region 118 includes N type majority carrier dopants at a dopant concentration greater than a dopant concentration of the remainder of the second implanted region 118 (e.g., labeled "N+").

The ESD protection device 101 also includes a conductive field plate 130 disposed on part of the second side of the semiconductor layer 106. In one example, the conductive field plate 130 is or includes polysilicon, which can be doped with impurities in one implementation. The conductive field plate 130 extends along the first direction X over a portion of the first implanted region 116 from the first implanted portion 126 thereof, past the first implanted region 116 and over a portion of the isolation layer 114. The conductive field plate 130 extends over a portion of the isolation layer 114 by a non-zero overlap distance 131. The first isolation layer 114 has a thickness 132 along the second direction Z, such as about 0.6 µm in one example. The overlap distance 131 is 3.5 to 5.0 times the isolation layer thickness 132. The ESD protection device 101 in FIGS. 1 and 2 also includes a second isolation layer 114 that extends in a corresponding second trench in the second side of the semiconductor layer 106 in the first implanted region 116. The second isolation layer 114 is laterally spaced apart from the first isolation layer 114 and has a width 133 along the first direction X of 4 µm to 8 µm.

In one example, the overlap distance 131 is 2.2 to 3.0 µm, the isolation layer thickness 132 is 0.6 µm, the n-type majority carrier concentration of the third implanted region 120 is about $2 \times 10^{16}$ cm$^{-3}$ at or near the top of the region 120 beneath the STI isolation layer 114, and the implanted depth of the third implanted region 120 below the STI isolation layer 114 along the second direction Z is in a range from 3 µm to 16 µm, such as 6-7 µm, for a 100 V breakdown voltage rating of the ESD protection device 101. As discussed below in connection with FIGS. 20-24, the relative sizes of the overlap distance 131, the isolation layer thickness 132, and the dopant concentration of the third implanted region 120 are tailored in ratiometric fashion to control (e.g., mitigate) breakdown voltage variation with handle substrate biasing in operation of the ESD protection device 101, wherein controlling the ratio of the overlap distance 131 to the isolation layer thickness 132 in a range of 3.5 to 5.0 provides benefits in terms of breakdown voltage stability for the electronic device 100. In another example, for an isolation layer thickness 132 of 0.6 µm and a nominal breakdown voltage of around 100 V (e.g., +/−2 V), the overlap distance 131 is in a range of 2.2 µm to 3.0 µm (e.g., the ratio of the overlap distance 131 to the isolation layer thickness 132 is in a range of 3.67 to 5.00).

The multi-layer metallization structure 108 in the electronic device 100 includes conductive structures that electrically connect the cathode C and the gate G of the SCR 101 to one another. This provides an ESD protection device 101 that can be triggered by an ESD event that causes a voltage of a protected node of the device 100 to exceed a given designed breakdown voltage level. In one example described below in connection with FIG. 18, the ESD protection device 101 is connected to a protected pad (e.g., externally accessible pin, lead, etc.) of an IC electronic device to protect an internal circuit from ESD events associated with the protected pad. The example metallization structure 108 in FIG. 1 includes a first level 140 with a pre-metal dielectric (PMD) material layer 141 (e.g., $SiO_2$), with conductive (e.g., tungsten, aluminum, copper, etc.) contacts 142 at select locations to provide electrical connection to the implanted portions 124, 126, 128 and 129 for selective interconnection of the terminals of the ESD protection device 101. The metallization structure 108 includes a second level 150, with an inter-level or inter-layer dielectric (ILD) material layer 151 (e.g., $SiO_2$) and conductive features 152 (e.g., copper, aluminum, etc.), as well as a third level 160 with an associated ILD layer 161 and conductive features 162, and a final level 170 with an ILD layer 171 and conductive features 172.

The sectional top view of FIG. 2 illustrates an example of the racetrack or finger shape, for a single finger example of the SCR ESD protection device 101. In the illustrated example, the finger shape includes a first (e.g., upper) end and an opposite second (e.g., lower) spaced from one another along the third direction Y. The finger shape includes a straight portion 200 that extends along the third direction Y, as well as a first (e.g., upper) turn portion 201 at the first end of the finger shape, and a second (e.g., lower) turn portion 202 at the second end of the finger shape. In this example, the first implanted region 116 and the second implanted region 118 extend in the straight portion 200, as well as around the first and second turn portions 201 and 202, respectively. Extending the first and second implanted regions 116 and 118 around the turn portions 201 and 202 provides improved ESD current carrying capability for the SCR ESD protection device 101 and mitigates ESD current carrying capability variations even in the presence of handle substrate biasing during operation of the electronic device 100.

In the example electronic device 100 of FIGS. 1 and 2, the SCR ESD protection device 101 is fabricated on and/or in the upper SOI semiconductor layer 106, which affects the voltage potential distribution inside the ESD protection device 101 and its breakdown voltage. The conductive field plate 130 can counteract the bottom substrate biasing effect and reduce/eliminate handle substrate effects on the breakdown voltage of the ESD protection device 101. In addition, the example SCR ESD protection device 101 includes the second isolation layer (e.g., STI) between the gate and cathode implanted portions 124 and 126 in the first implanted region 116, which helps control latch-up by increasing the gate resistance and improve the breakdown voltage stability and enhance the ESD current carrying capability with respect to handle substrate biasing effects.

FIGS. 2 and 3 show one implementation of the SCR ESD protection device 101 that includes multiple finger shapes, including first and second illustrated finger shapes F1 and F2. The view in FIG. 2 is taken along line 2-2 in FIGS. 1 and 4, showing the relative positioning of the implanted portions 128 (P+) and 129 (N+) of the second implanted region 118, where the implanted portion 129 is along the respective center 180 of each of the illustrated finger shapes F1 and F2. FIG. 2 further shows the successively outlying STI isolation layer 114, the first implanted region, including the implanted portion 126 (N+) and the implanted portion 124, respectively. In this example, the individual finger shapes F1 and F2 are encircled or surrounded by further portions of the STI isolation layer 114, although not a requirement of all possible implementations. In addition, the adjacent finger shapes F1 and F2 are laterally spaced along the first direction X by a non-zero spacing distance 220, for example, on the same order of magnitude as the X-direction width of the first implanted region 116 within the straight portions 200 of each of the individual finger shapes F1 and F2. Non-uniform current conduction that may result in one finger shape in an array, and thermal spreading in adjacent finger shapes may result in thermal failures in the middle of each finger. The illustrated example provides the spacing distance 220 to mitigate or prevent heat sharing between fingers, and the spacing distance 220 can be designed in one example based on an expected ESD transmission line pulse (TLP) pulse width and heat spreading characteristics of the materials of the device 101 in order to mitigate high temperatures in the middle of array and to also mitigate small area premature latch-up resulting in current crowding.

In the illustrated example, the respective first, second, and third implanted regions 116, 118 and 120 extend along the second direction Y in the straight portion 200 of each individual finger shape, and the second implanted region 118 extends along the center 180 of each respective finger shape, although not a requirement of all possible implementations. In addition, the implanted regions 116 and 120 extend in turn portions 201 and 202 at the opposite first and second ends of the straight portion 200 of implanted region 118 extends along the center 180 of each respective finger shape. In one implementation, the isolation layers 114 and the conductive field plate 130 extend in the straight portions 200 of each respective finger shape, as well as in the first and second turn portions 201, 202 of the finger shapes, although not a requirement of all possible implementations. The illustrated example provides a full racetrack implementation of the individual finger shapes F1 and F2, where the individual finger shapes are substantially identical to one another, although not a requirement of all possible implementations. The example full racetrack combination of the respective layers, regions and field plates 114, 116, 120 and 130 around the center second implanted region 118 facilitates uniform latch-up and enhanced current carrying capability of the SCR ESD protection device 101.

In another possible implementation, the implanted portions 124 and 126 of the first implanted region 116, and the implanted portions 128 and 129 of the second implanted region 118, as well as the corresponding contacts 142 in the PMD layer 141 (e.g., FIG. 1) extend along the Y direction through the straight portions 200 of each respective finger shape, but do not extend through the respective first and second turn portions 201 and 202. In another possible implementation, the implanted portions 124, 126, 128 and 129 extend in the straight portion 200, but not in the respective first and second turn portions 201 and 202. In the illustrated example, including the first turn portion 201 shown in the section view of FIG. 4, the implanted portions 128 and 129 of the second implanted region 128 extend only in the straight portion 200 of the finger shape, but do not extend in the turn portions 201 or 202. In this example, moreover, the contacts 142 associated with the implanted portions 124, 126, 128 and 129 extend in the straight portion 200, but not in the respective first and second turn portions 201 and 202. This helps prevent turn on of the curvature PNP transistor of the SCR ESD protection device 101, and instead helps to ensure that the NPN portion of the SCR 101 turns on and undergoes latch-up in response to an ESD event, to facilitate uniform latch-up and mitigate hotspots associated with undesired turn on of small portions of the ESD protection device 101. In one example, the elimination of the contacts 142 in the turn portions 201 and 202 reduces or minimizes corner affects, particularly for the illustrated device 101 that combines a curvature PNP in the turn portions 201 and 202 and a dominant SCR in the straight portion 200 of the finger shapes F1 and F2.

As further shown in FIGS. 2 and 3, the example finger shapes F1 and F2 are elongated in the turn portions 201 and 202. The second implanted region 118 in this example is spaced apart from the first implanted region 116 along the first direction X by the first distance 134 in the straight portion 200 of the finger shape F1, F2. In the turn portions 201 and 202 of the finger shapes, the second implanted region 118 is spaced apart from the first implanted region 116 (e.g., along the Y direction in the section view shown in FIG. 4) by a second distance 234, where the second distance 234 is greater than the first distance 134. In one example, the second distance 234 is 1.5 to 2.0 times the first distance 134 (i.e., the ratio of the second distance 234 to the first distance 134 is in a range of 1.5 to 2.0). In one example, ratio of the second distance 234 to the first distance 134 is 1.61. The upper range of the ratio of the distances 234 and 134 can be higher than 2.0, but extreme elongation of the turn portions 201 and 202 occupies large amounts of die space.

The non-unity ratio of the distances 234 and 134 mitigates or avoids undesired turn on of the parasitic PNP transistor associated with the curvature of the turn portions 201 and 202 of the finger shapes F1 and F2. Where the distances 134 and 234 are substantially equal, the curvature PNP transistor behaves like a shorter LDD device in combination with the overall SCR structure. Elongation of the curved portions of the third implanted region 120 and any included lightly doped drain implanted portions, helps to disable the curvature PNP transistor by increasing drift region length in the turn portions 201 and 202, such that the parasitic PNP corner device does not turn on even at large currents. This ensures that the SCR structure dominates the turn on performance in response to ESD events to mitigate or prevent premature latch-up of the SCR ESD protection device 101. The described examples provide enhanced latch up uniformity and breakdown voltage stability compared to other solutions that do not use full racetrack layout for the implanted regions 116 and 120. In addition, the discontinuation of the contacts in the turn portions 201 and 202 provides additional benefits with respect to breakdown voltage uniformity and enhanced ESD current carrying capability of the example ESD protection devices 101.

These features provide particular benefits in association with SOI structures for improved ESD ratings, and facilitate ESD protection in SOI IC technologies with smaller, more efficient ESD protection structures with decreased layout sensitivity. In other examples, similar techniques can be used in combination with finger structures that have the p-type first implanted region 116 along the center of the individual finger structures. In addition to the above benefits, the provision of the isolation layer 114 (e.g., STI structures) between the emitter and base of the NPN portion of the SCR device 101 helps control latch-up by increasing the base resistance Rb. Moreover, the full racetrack design layout for all diffusions and device features of the described examples facilitates the same or uniform Rb in the corners of the turn portions 201 and 202, which in turn improves the ESD current handling capability and results in more uniform snap-back. Also, multi-finger implementations provide buffer space 220 between each SCR finger to mitigate heat spreading from one finger to another. In operation, when the SCR device 101 latches in the on state, potentially high current will flow through the N-P-N turned-on portion of the device 101, and the layout aspects described above facilitate uniform turn on of the device, particularly along the Y direction in the straight portion 200 of the finger shapes F1 and F2, thereby mitigating or avoiding creation of hot spots and the associated reliability degradation.

Referring now to FIGS. 5-17, FIG. 5 shows a method 500 for fabricating an electronic device, such as an IC with an ESD protection device. FIGS. 6-17 show the electronic device 100 of FIGS. 1-4 and the SCR ESD protection device 101 at different stages of fabrication according to the method 500 of FIG. 5. The method 500 shows acts and events associated with construction of the example SCR ESD protection device 101, and these steps may concurrently be used for fabricating other electronic circuits and/or components (e.g., transistor circuits, etc.) in a single IC with the ESD protection device 101, and a metallization structure (e.g., the metallization structure 108 in FIG. 1) can be constructed according to the method 500 to connect one or more terminals of the ESD protection device 101 to a protected circuit of the IC (not shown).

Figure 5:
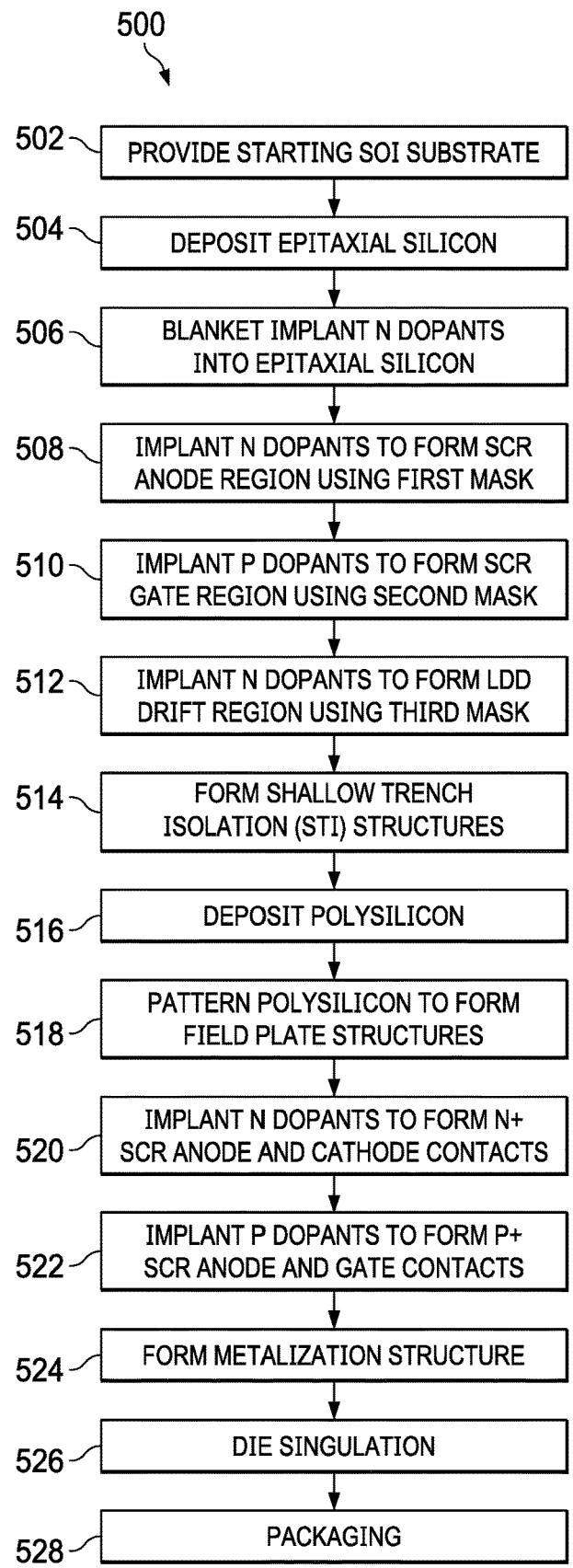
FIG. 5 is a flow diagram of a method for making an ESD protection device in an integrated circuit.
Figure 6:
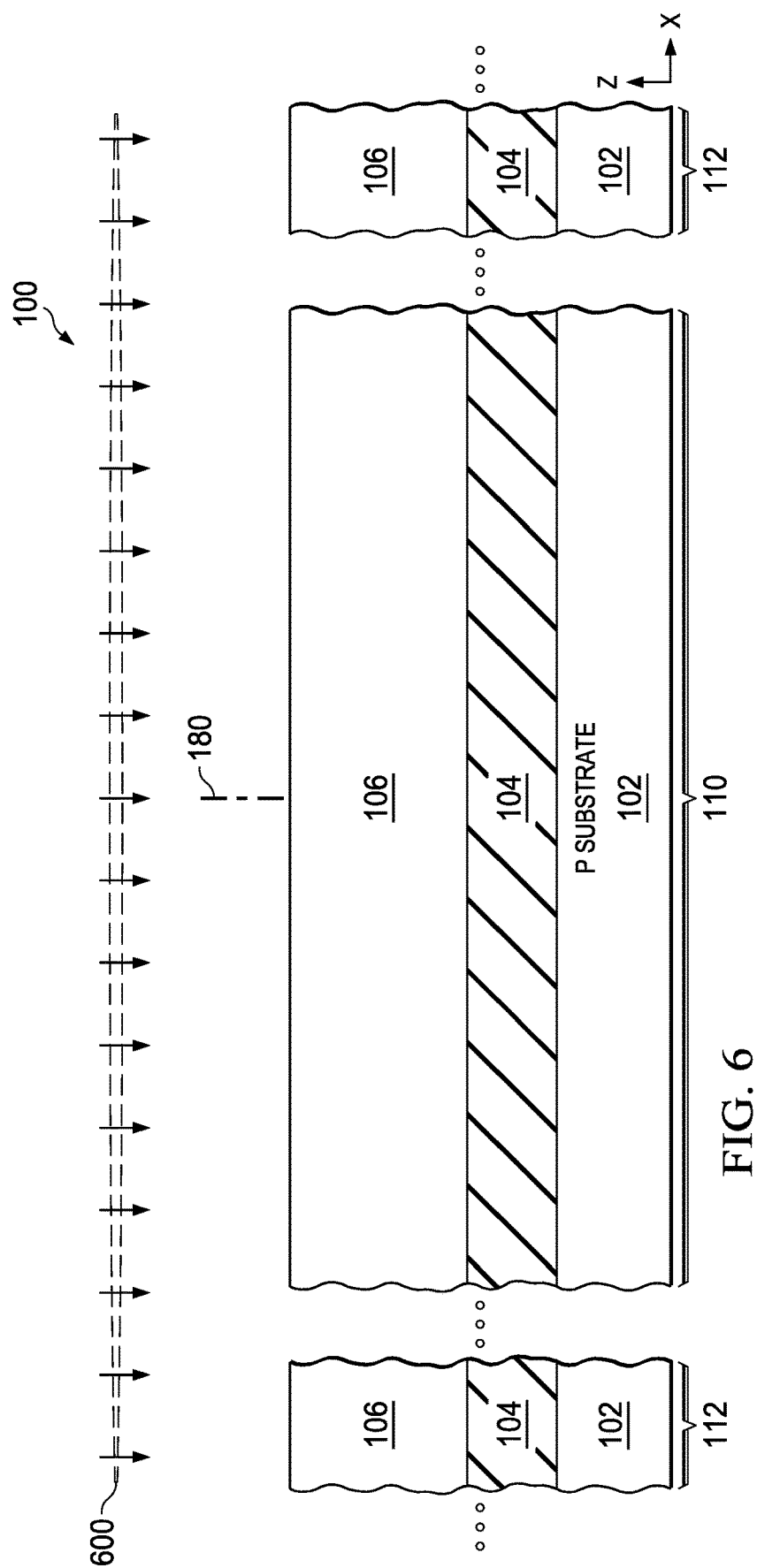
FIGS. 6-17 are partial sectional side elevation views of the electronic device of FIGS. 1-4 at different stages of fabrication according to the method of FIG. 5.
Figure 7:
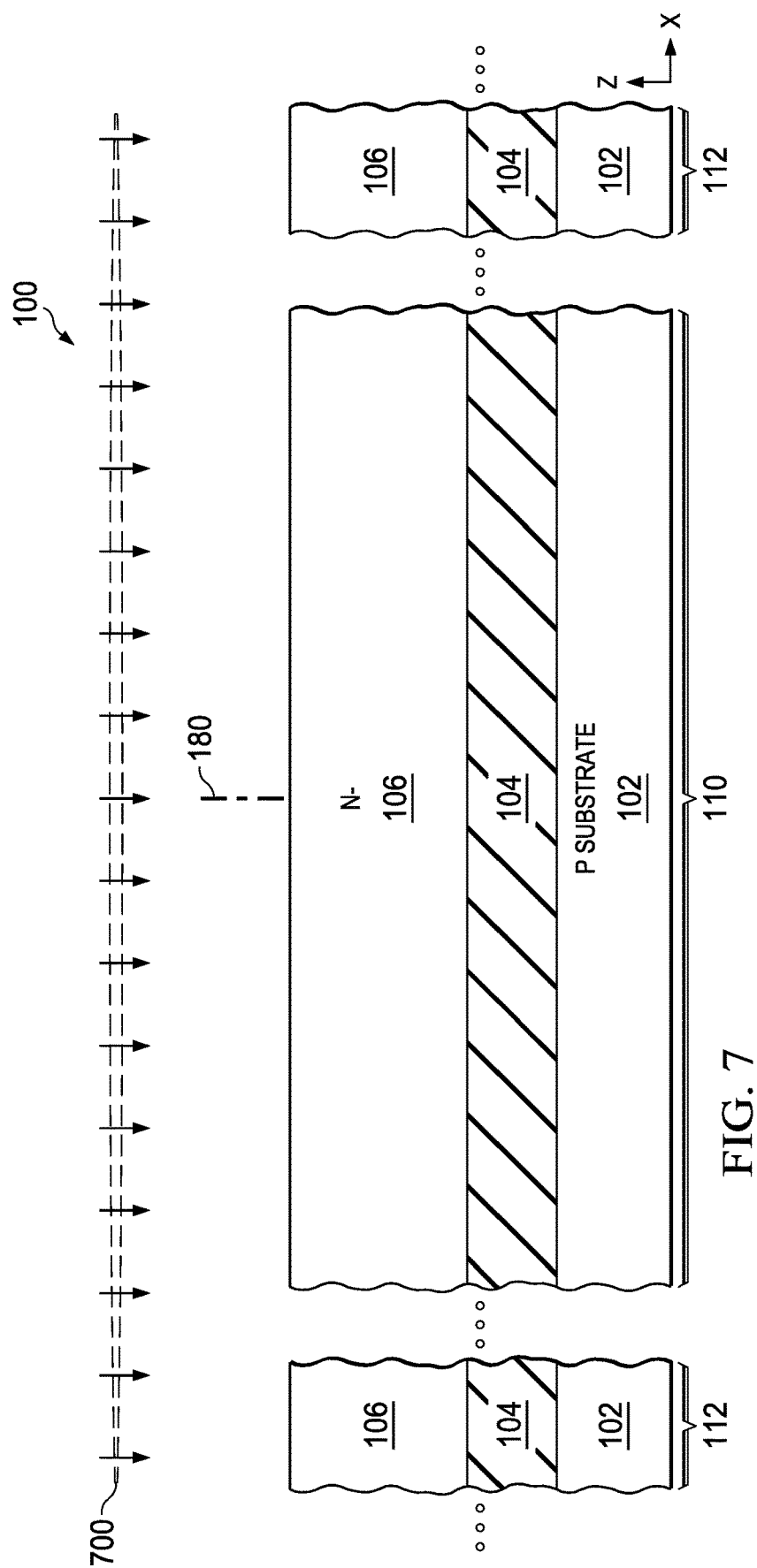

The method 500 includes providing a starting SOI substrate at 502 in FIG. 5. In one example, an n-doped silicon handle substrate 102 and an insulator (e.g., $SiO_2$) layer 104 is provided at 502. FIG. 6 shows an example starting SOI substrate 102, 104 including a prospective active region 110 and a surrounding isolation region 112. Similar processing is shown for the active region 110 and the isolation region 112 in FIGS. 6-17. In other examples, different processing is used to form an isolation barrier in the region 112 that surrounds the active region 110, for example, forming deep trench isolation structures and/or different doping in the isolation region 112 to electrically isolate circuitry of the active region 110, or portions thereof, from other circuits outside the active region 110.

The example handle substrate 102 is or includes silicon with n-type dopants (e.g., phosphorus), but other semiconductor materials or combinations thereof can be used in other implementations. At 504, one or more epitaxial layers are formed (e.g., deposited) on the upper second side of the insulator layer 104. FIG. 6 shows one example, in which an epitaxial growth deposition process 600 is performed, which deposits the epitaxial silicon layer 106 on the upper second side of the insulator layer 104. The process 600 in one example forms n-doped epitaxial silicon layer 106. In other example, a separate blanket implantation process 700 (FIG. 7) is performed at 506 in FIG. 5 to implant n-type dopants (e.g., phosphorus) into the epitaxial silicon layer 106. Various implantation steps and processes are used in the example method 500, some or all of which may include subsequent thermal processing, such as annealing to activate and diffuse implanted dopants. In addition, the plantation processes can be concurrently used for implanting features of other circuitry (not shown), such as source and drain regions for field effect transistors, including LDD implants to fabricate transistors of other circuitry outside the illustrated active region 110.

Figure 8:
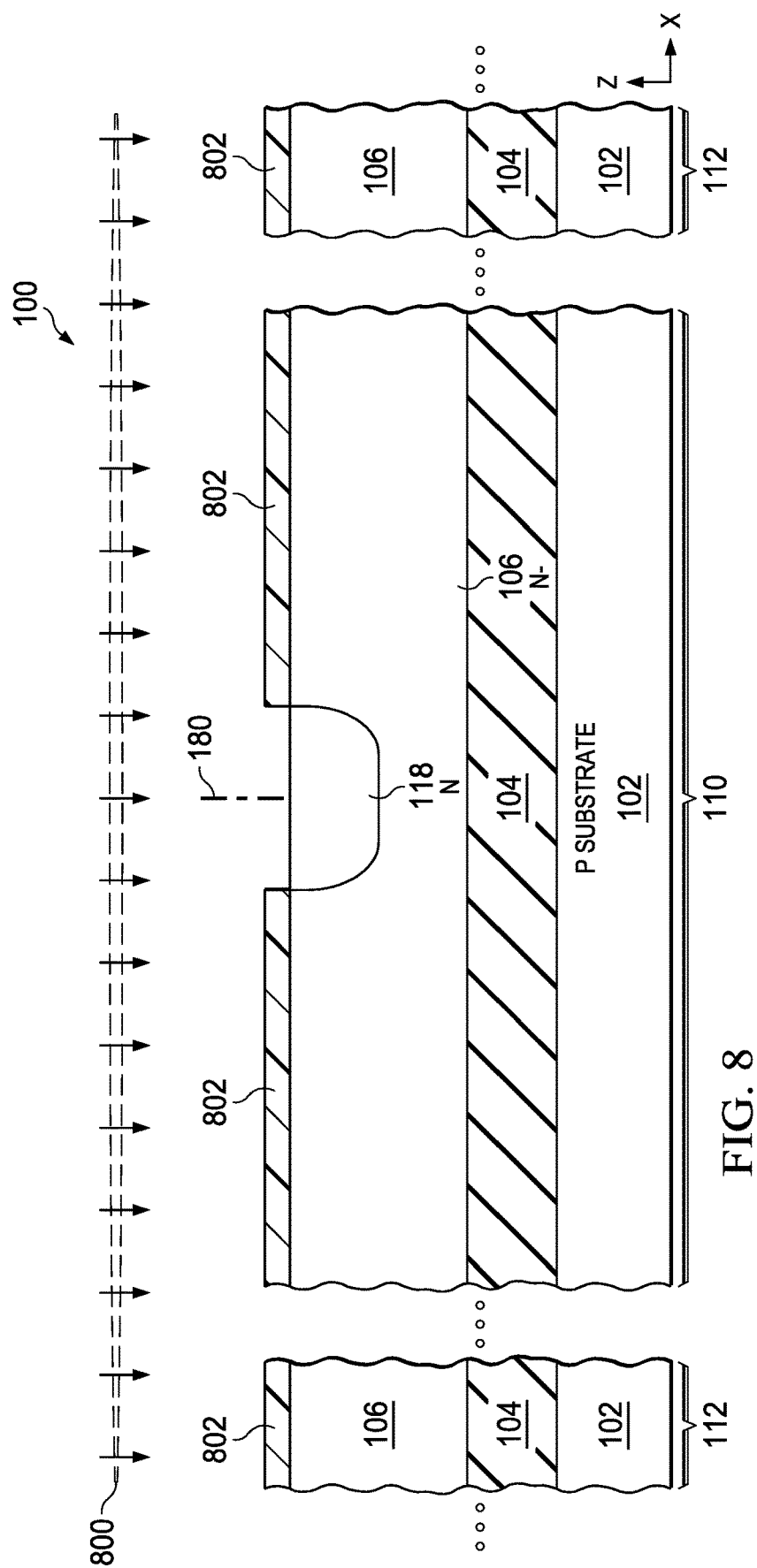
Figure 9:
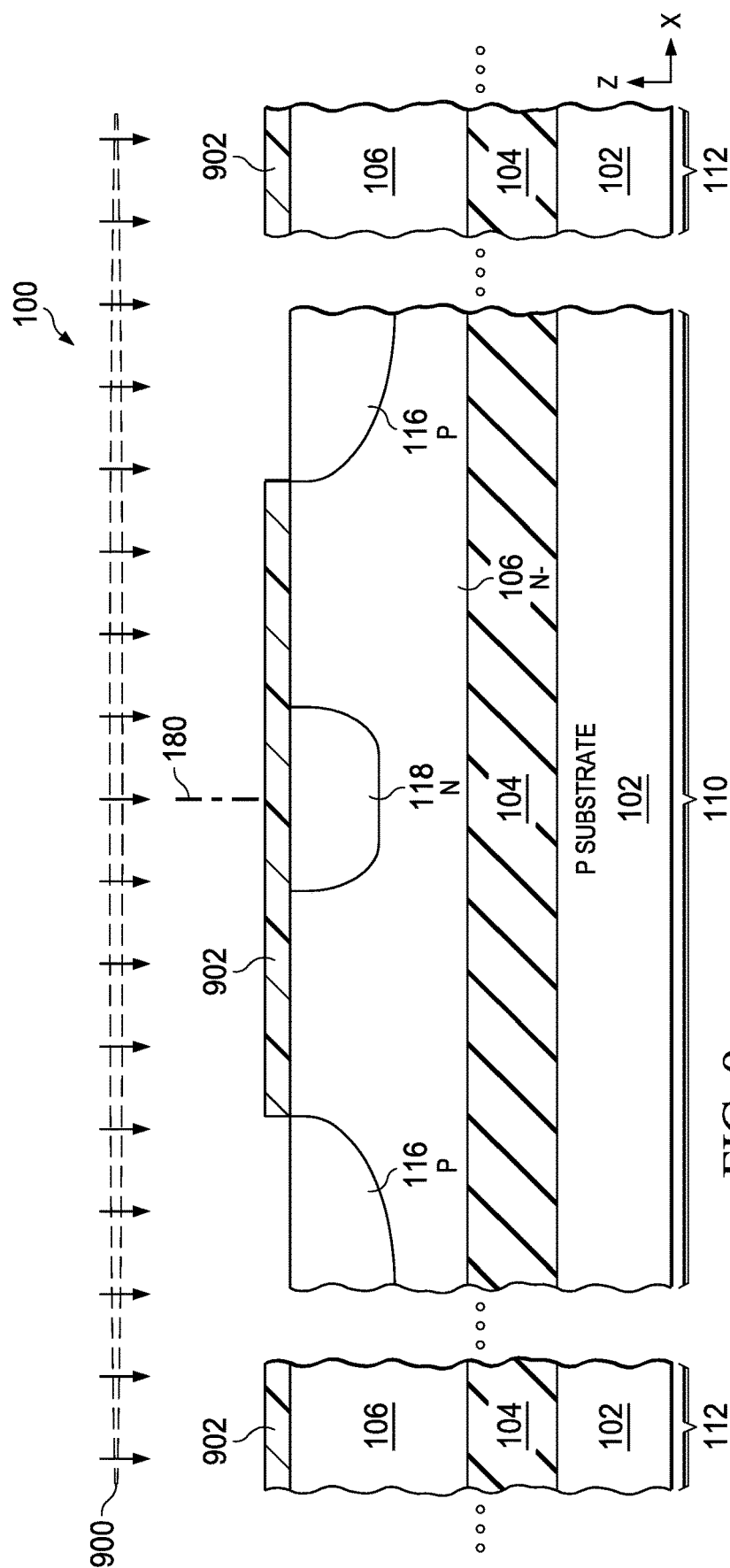

The method 500 continues at 508 with implanting n-type dopants to form SCR anode regions using a first mask. FIG. 8 shows one example, in which an implantation process 800 is performed using a first implant mask 802. The process 800 in one example implants phosphorus or other n-type dopants into an exposed portion of the upper second side of the semiconductor layer 106 to form the second implanted region 118 disposed along a portion of the upper second side of the semiconductor layer 106. At 510 in FIG. 5, the method 500 continues with implanting p-dopants to form an SCR gate region using a second mask. FIG. 9 shows one example, in which an implantation process 900 is performed using an implantation mask 902. The implantation process 900 implants boron or other p-type dopants into an exposed portion of the upper second side of the semiconductor layer 106 to form the first implanted region 116.

Figure 10:
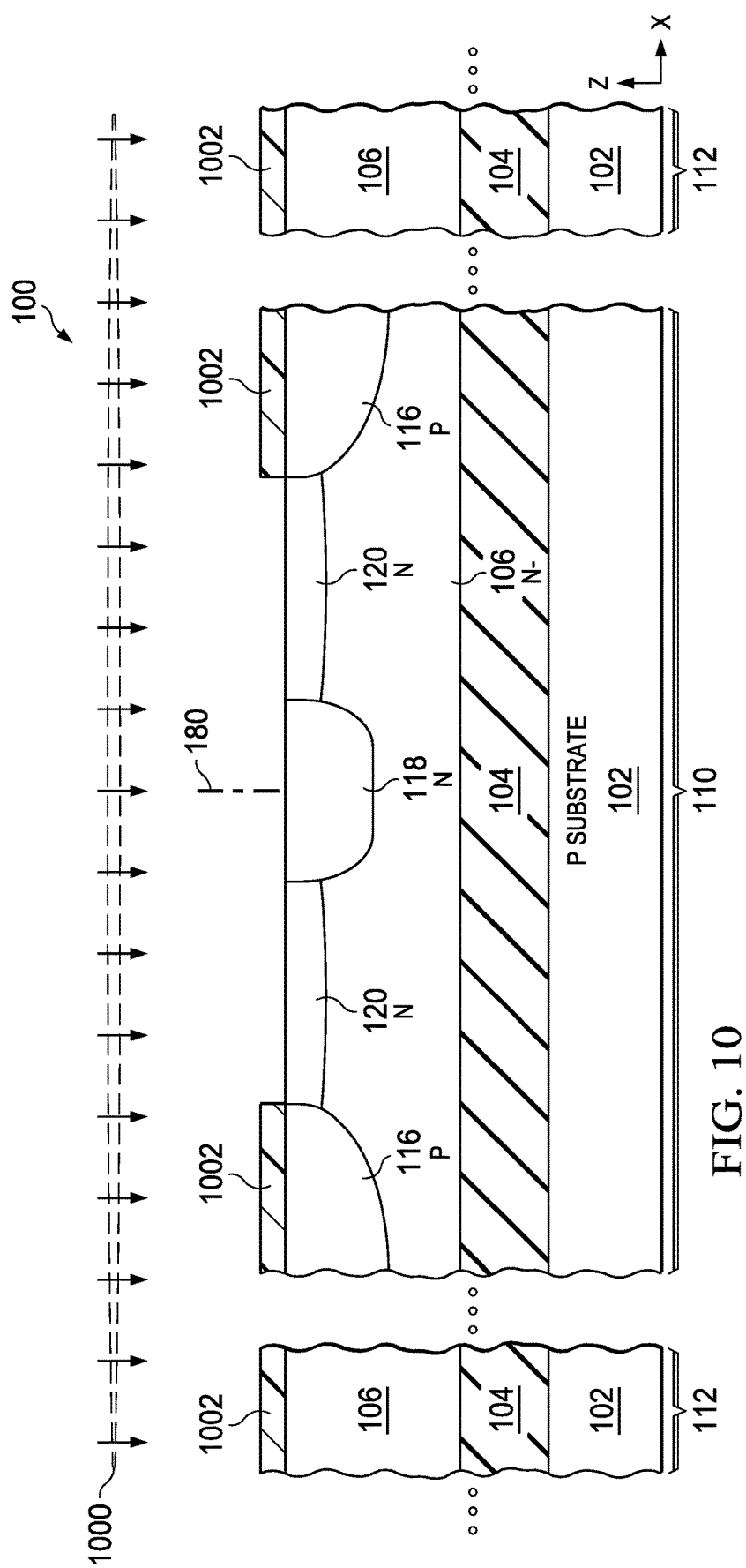

The method 500 continues at 512 with implanting n-type dopants to form the third implanted region 120, for example, using a lightly doped drain (LDD) implantation and mask that are concurrently used elsewhere in the electronic device 100 to form other circuits (not shown). FIG. 10 shows one example, in which a third implantation process 1000 is performed using a third implant mask 1002, which implants phosphorus or other n-type dopants into the exposed region between the portions of the first implanted region 116. In this example, the implant mask 1002 exposes the previously n-doped second implanted region 118, although the mask 1002 in other examples covers the second implanted region 118.

In one example, the implantation process 1000, and any subsequent thermal annealing process are tailored to control the final dopant concentration of the third implanted region 120 to be tailored according to the overlap distance 131 (e.g., FIG. 1) of the subsequently formed conductive field plate over a portion of the isolation layer 114, and to the first isolation layer thickness 132. In one example, the implantation process 1000 in FIG. 10 forms the third implanted region 120 with n-type majority carrier dopants (e.g., phosphorus) at a dopant concentration of $5 \times 10^{15}$ cm$^{-3}$ to $1 \times 10^{17}$ cm$^{-3}$, such as about $2 \times 10^{16}$ cm$^{-3}$, at or near the top of the region 120 beneath the subsequently formed STI isolation layer 114 (e.g., FIG. 1 above) to provide a drift region 122 between the respective first and second implanted regions 116 and 118. In one example, the implantation process 1000 and any subsequent annealing create the third implanted region 120 with an implanted depth from 3 μm to 16 μm, such as 6-7 μm, below the bottom of the subsequently formed STI isolation layer. The mask 1002 in the illustrated example includes elongated openings for the elongated drift region in the turn portions of the device 100 to provide the spacing distance 134 in the straight portion 200 of the finger shapes (e.g., FIGS. 1 and 2 above) in combination with the extended spacing distance 234 in the turn portions to oh one and 202 of the figure shapes (e.g., FIGS. 2 and 4).

Figure 11:
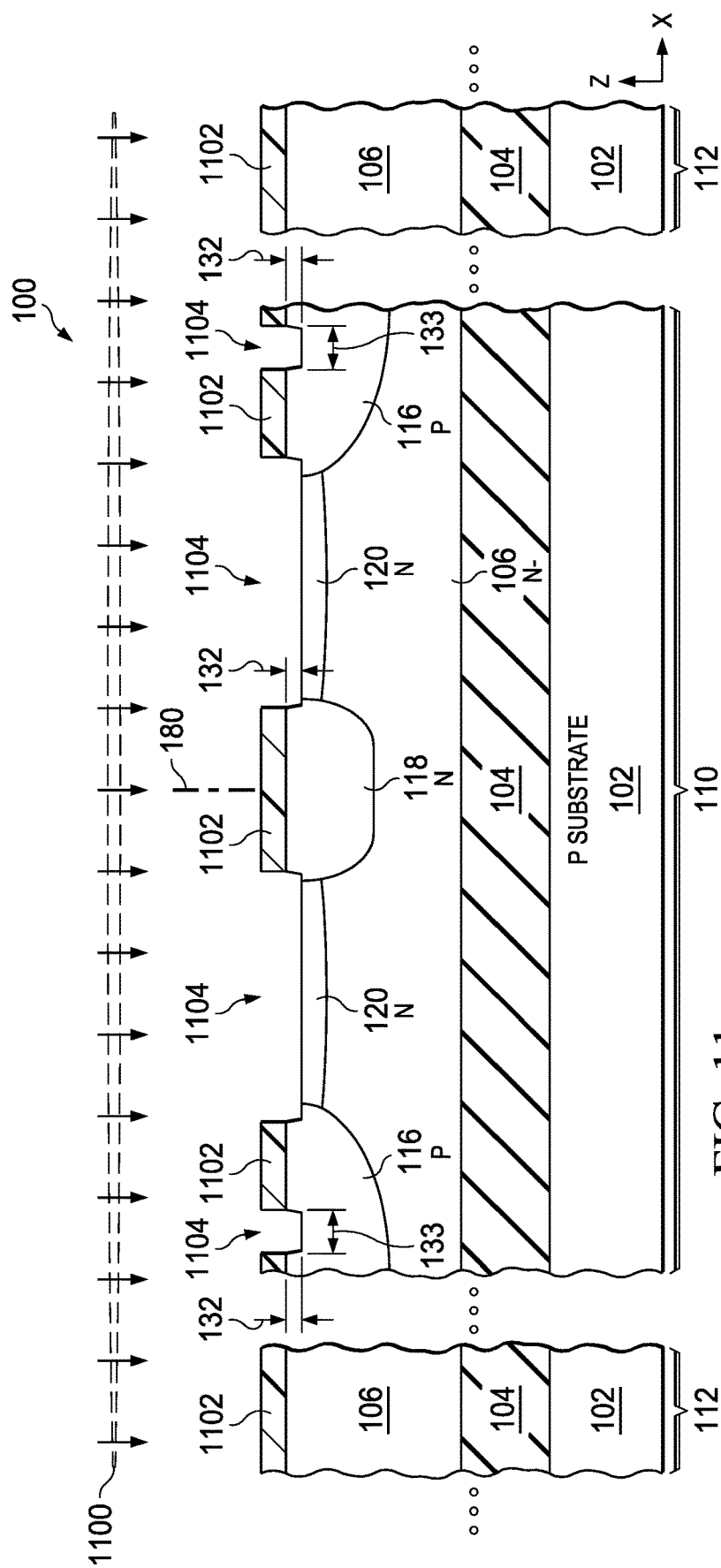
Figure 12:
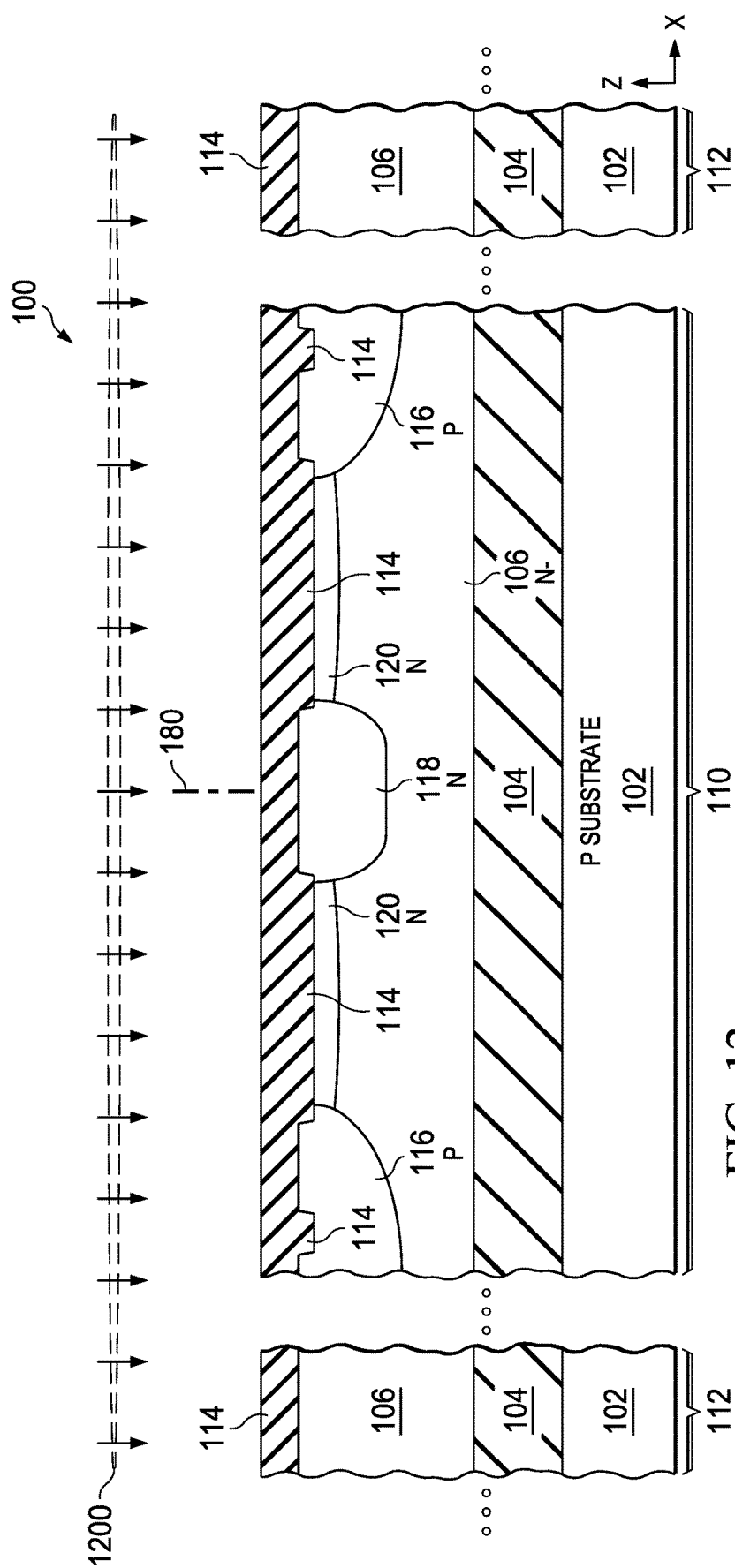
Figure 13:
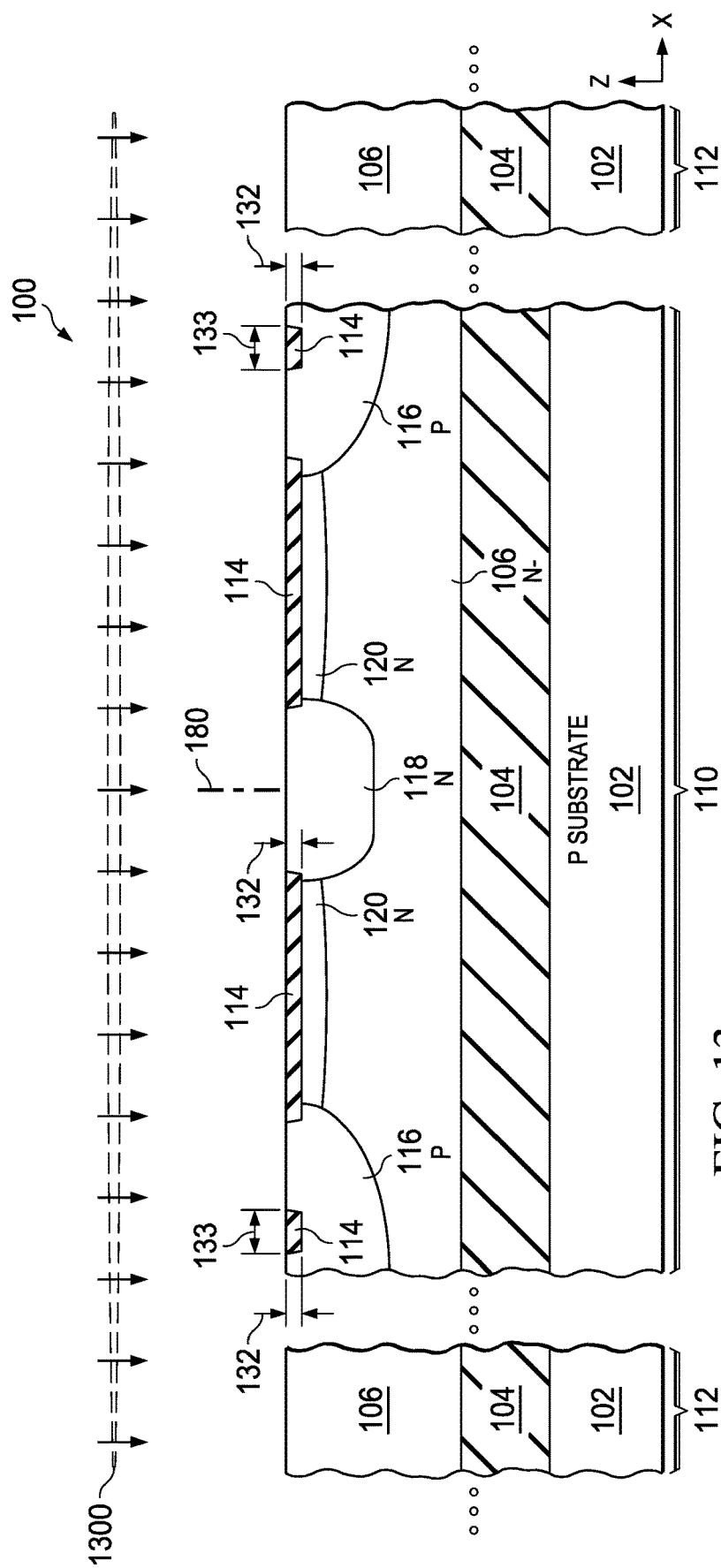
Figure 14:
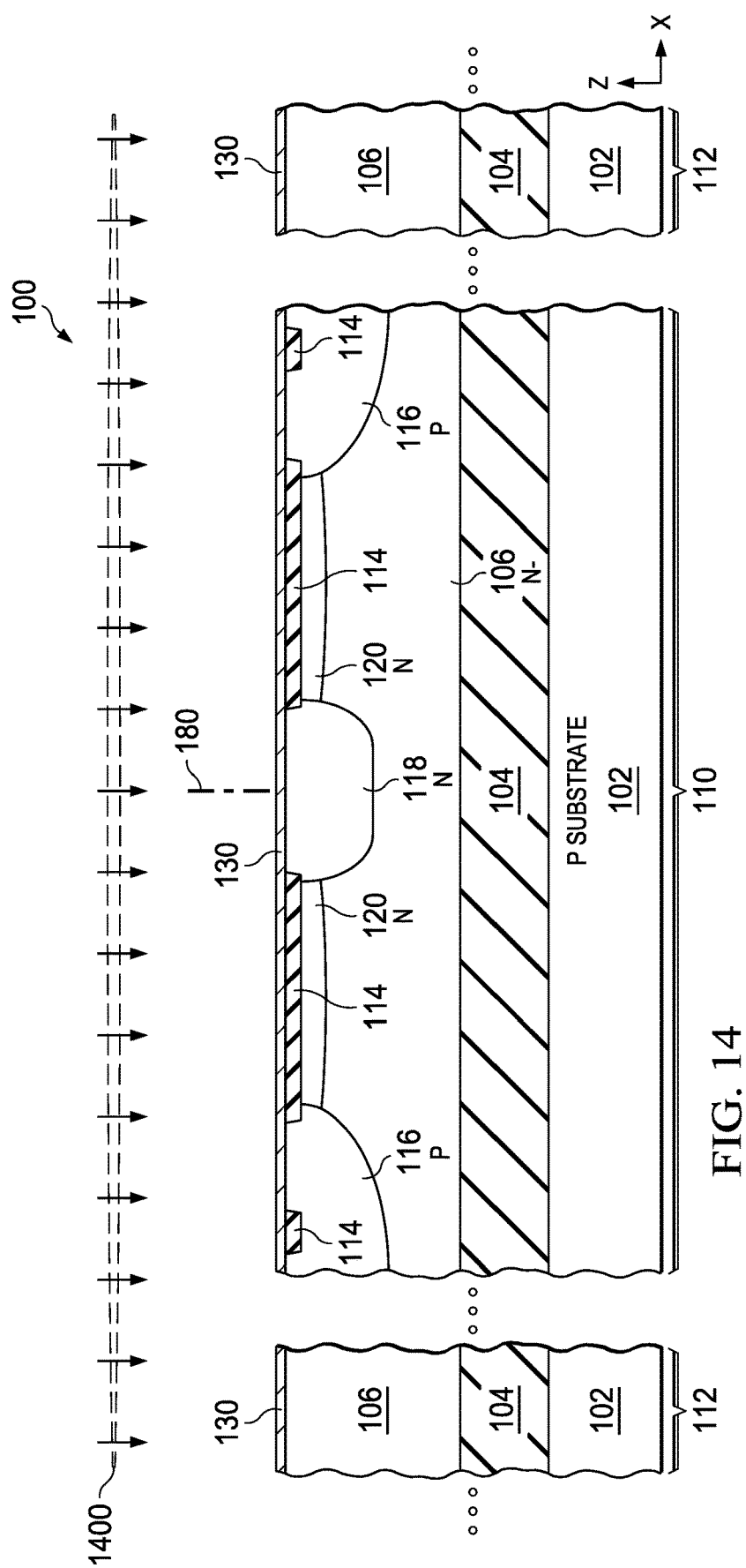

The method 500 continues at 514 in FIG. 5 with a shallow trench isolation processing to form shallow trench isolation layers (e.g., 114 in FIG. 1). Other processes can be used, such as local oxidation of silicon (LOCOS) processing at 220 to form SiO$_2$ isolation layers 114. FIGS. 11-13 show one example of STI processing at 514. FIG. 11 shows an example of STI trench formation, including performing an etch process 1100 with an etch mask 1102. The etch process 1100 in one example etches through exposed portions of the upper second side of the semiconductor layer 106 to form trenches 1104 having a depth 132 tailored according to a design overlap distance 131 (e.g., FIG. 1) of the subsequently formed conductive field plate over a portion of the isolation layer 114 in order to achieve a ratio of the overlap distance 131 to the isolation layer thickness 132 in a range of 3.502 5.0, such as 3.67 to 5.00. In the illustrated example, the etch process 1100 is continued for a controlled time in order to provide a trench depth 132 of approximately 0.6 μm.

The trench etch mask 1102 is then removed, and a blanket oxide deposition process 1200 is performed in FIG. 12 to deposit SiO$_2$ or other suitable isolation material 114 in the etched trenches. FIG. 13 illustrates a subsequent planarization process 1300, such as chemical mechanical polishing (CMP) that removes excess portions of the deposited isolation material 114, to leave the finished STI isolation structures 114. As further shown in FIG. 13, the SCR implementation of FIGS. 1-4 and 6-17 provides the second isolation layer having a lateral width 133 along the first direction X, where the trench etch mask 1102 in FIG. 11 includes openings tailored to achieve the isolation layer width 133 for the isolation layer 114 within the first implanted region 116. The isolation layers 114 may, but need not, have an upper surface that is generally coplanar with the upper second surface of the semiconductor layer 106.

Figure 15:
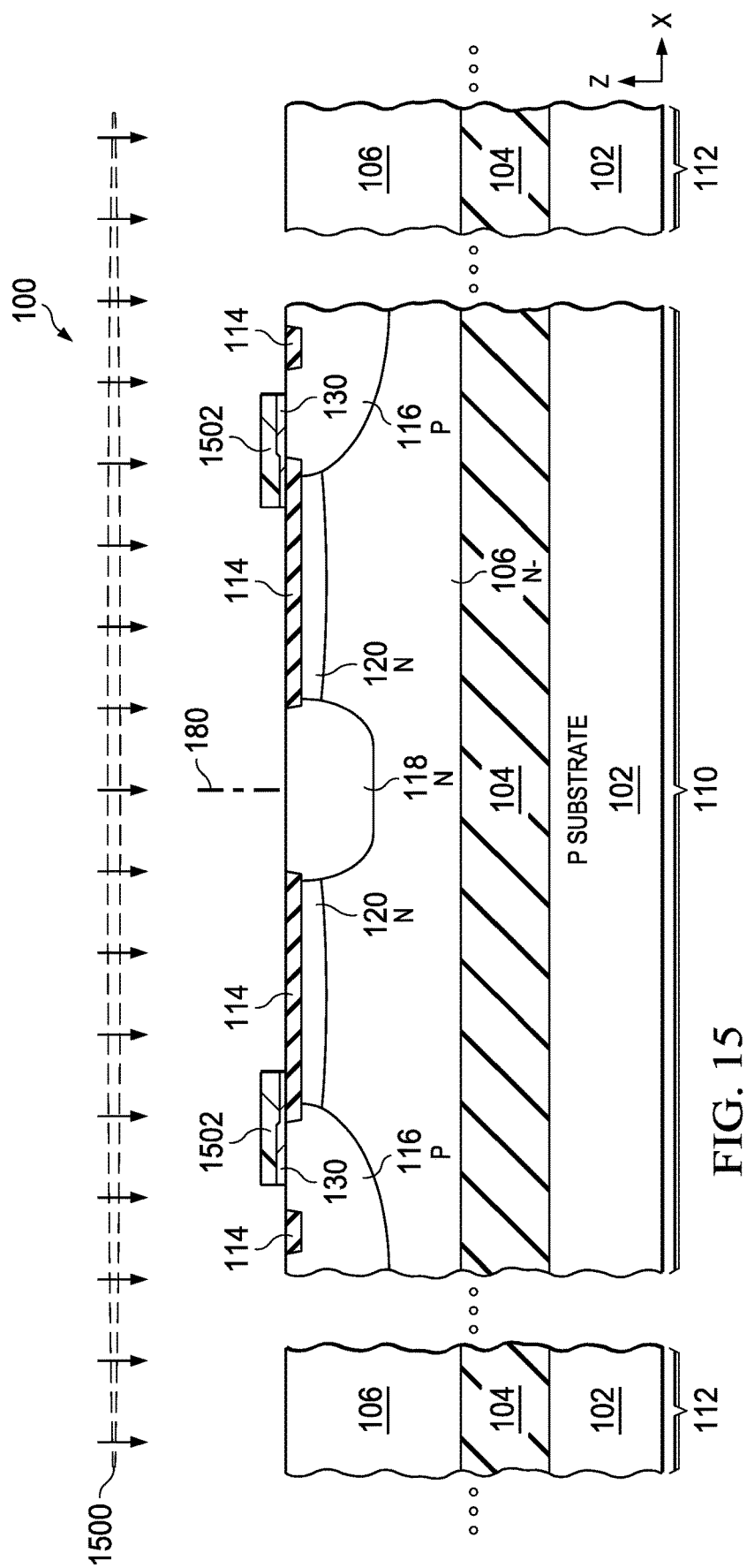

The method 500 continues at 516 and 518 in FIG. 5 with polysilicon processing to form a field plate structures (e.g., the conductive field plate 130 in FIG. 1 above). At 516, polysilicon is deposited, for example, using a blanket polysilicon deposition process 1400 and FIG. 14 that deposits polysilicon material 130 over the STI isolation layers 114 and the remaining exposed upper second side of the semiconductor layer 106. The polysilicon formation processing in FIG. 14 can include doping the deposited polysilicon to control the conductivity thereof. The deposited polysilicon is patterned at 518 in FIG. 5 to form the field plate structure. FIG. 15 shows one example, in which an etch process 1500 is performed using an etch mask 1502 to remove deposited polysilicon from the exposed portions of the isolation layers 114 and the remaining exposed upper second side of the semiconductor layer 106. The etch mask 1502 is then removed, to leave the patterned conductive polysilicon field plate 130.

Figure 16:
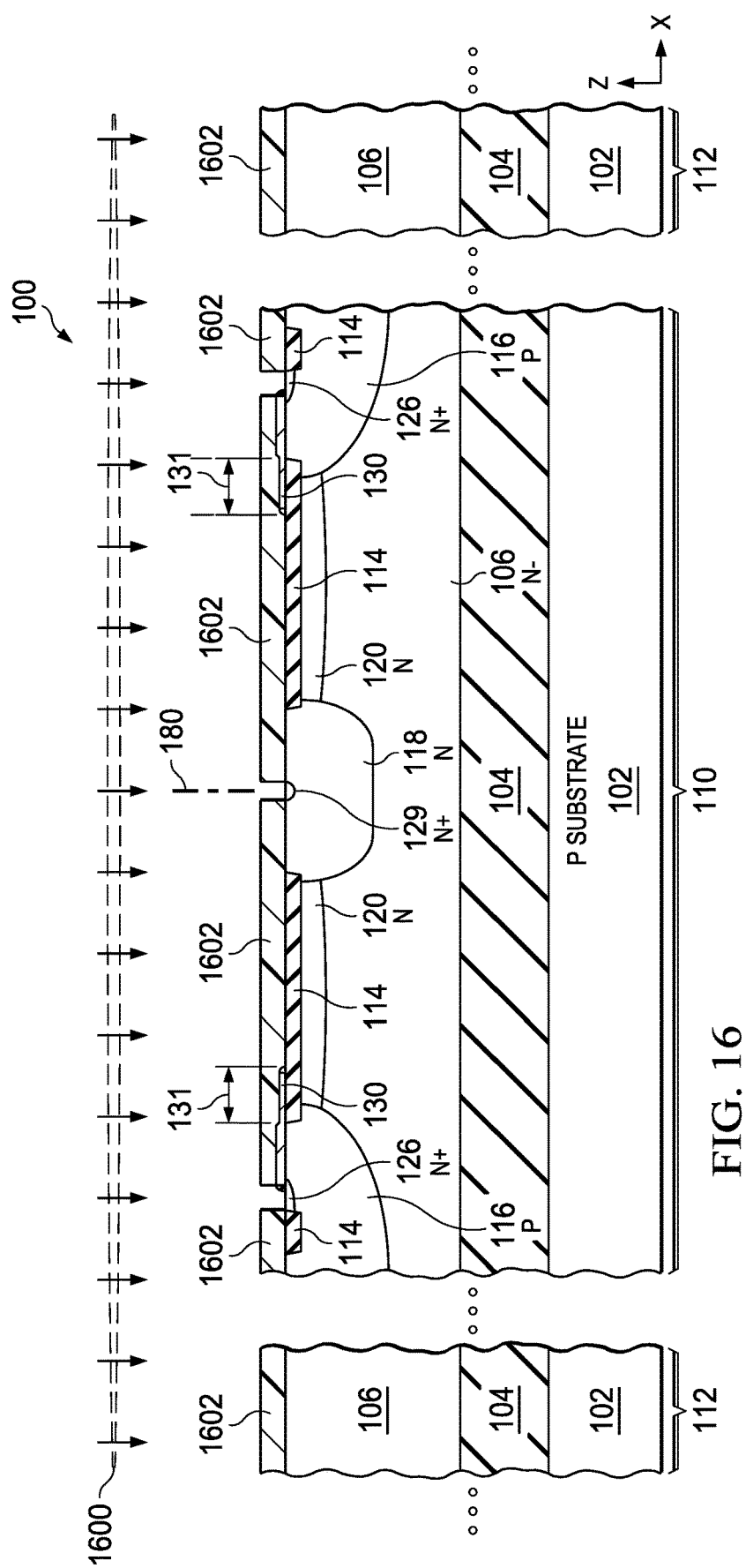

The method 500 continues at 520 in FIG. 5 with implanting n-type dopants to form heavily doped SCR anode and cathode contact implanted portions. FIG. 16 shows one example, in which an implantation process 1600 is performed with an implantation mask 1602. The implantation process 1600 implants phosphorus or other n-type dopants to form the implanted portion 126 of the first implanted region 116 and the implanted portion 129 of the second implanted region 118 (e.g., labeled N+ in FIG. 16). The process 1600 implants the n-type dopants to form the implanted portions 126 and 129 having higher dopant concentrations and the associated first and second implanted regions 116 and 118, respectively.

Figure 17:
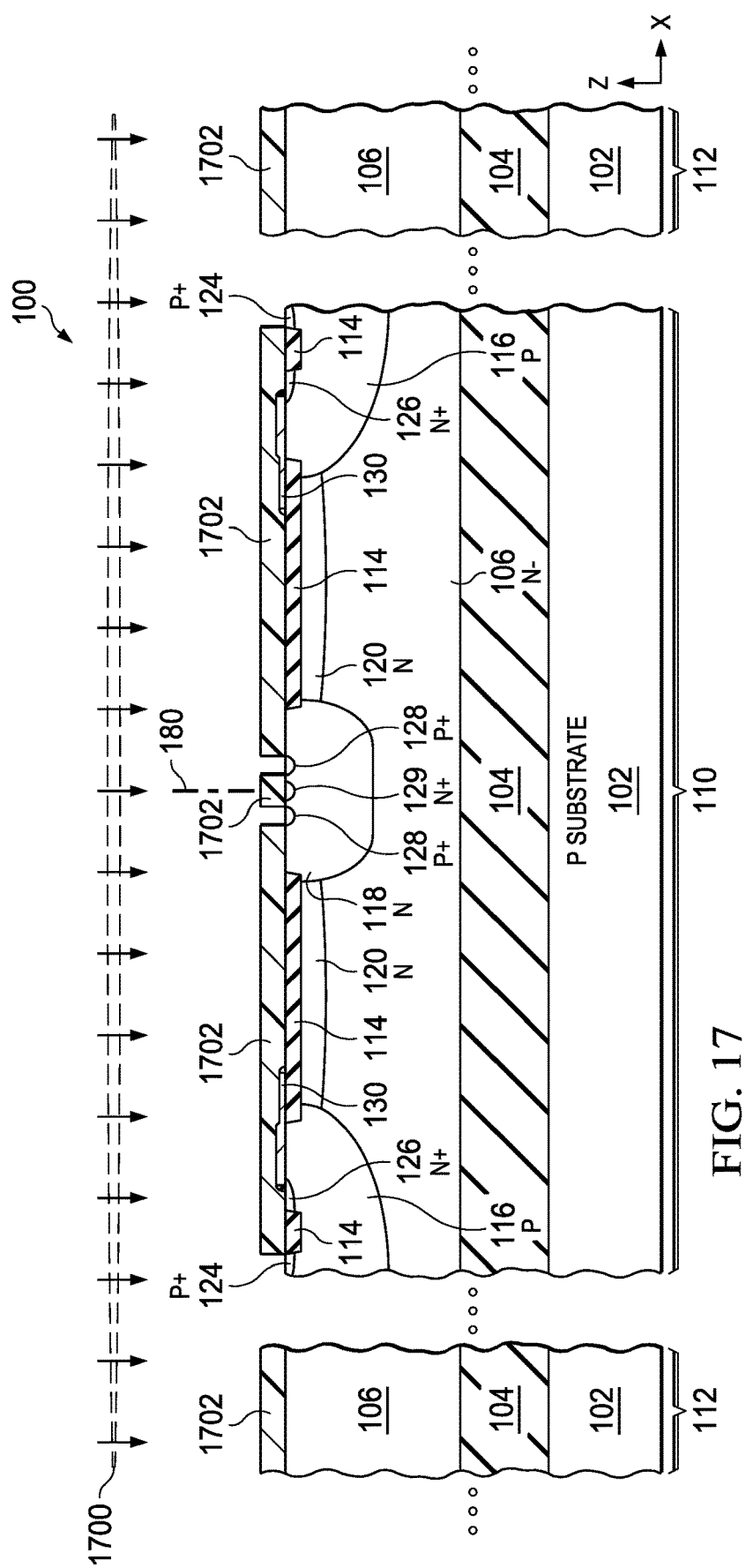

At 522 in FIG. 5, the method 500 continues with implanting p-dopants to form the P+ SCR anode and gate contacts. FIG. 17 shows one example, in which an implantation process 1700 is performed with an implantation mask 1702. The implantation process 1700 in this example implants boron or other p-type dopants to form the implanted portion 124 of the first implanted region 116 and the implanted portion 128 of the second implanted region 118 (labeled P+ in FIG. 17). The method 500 also includes back end processing, such as metallization processing at 524 to form contacts and metallization structures (e.g., the multi-level metallization structure 108 in FIG. 1 above). The method 500 also includes die singulation or separation at 526 in FIG. 5, and packaging at 528 in order to provide a packaged electronic device, such as an IC.

Figure 18:
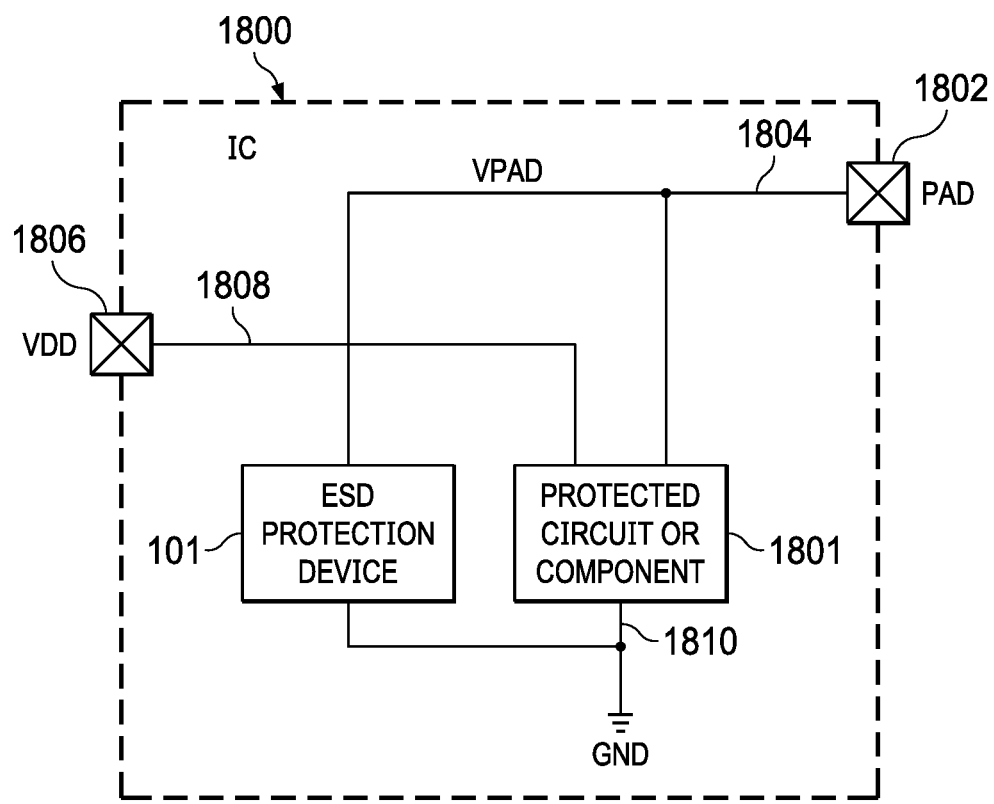
FIG. 18 is a schematic diagram of an integrated circuit with an ESD protection device.

FIG. 18 shows an example IC electronic device 1800 with an ESD protection device as described above (e.g., and SCR ESD protection device 101). The IC 1800 also includes a protected circuit or component 1801 connected between a protected pad 1802 (e.g., IC terminal, pin, pad, etc.) and an associated protected internal node 1804 and a reference voltage (e.g., GND). The IC 1800 also includes a power pad 1806 (e.g., to receive a supply voltage VDD), and an internal node 1808 connects the supply voltage from the power pad 1806 to the protected circuit or component 1801. In this example, the protected circuit or component 1801 is connected between the protected pad 1802 (e.g., the protected node 1804) and a reference node 1810 (GND), and the ESD protection device 101 is connected in parallel with the protected circuit or component 1801. In this example, the electronic device 1800 is an integrated circuit IC 1800 with the protected circuit or component 1801 connected to an externally accessible terminal or pad 1802, and wherein the ESD protection device 101 is electrically connected to the externally accessible terminal or pad 1802 of the IC 1800. ESD protection device 101 protects the circuit or component 1801 against ESD events associated with the externally accessible electrically conductive pad structure 1802, for example, when the protected pad is soldered to a host printed circuit board (PCB) or otherwise subject to hot-plug surges, switching noise or other transient voltage conditions. In steady state operation, with a supply voltage provided to the VDD pad 1806, voltage levels at the protected pad 1802 below the breakdown voltage rating of the ESD protection device 101 will not trigger conduction by the ESD protection device 101 and the protected circuit or component 1801 operates in a normal designed fashion. If an ESD event occurs at the protected pad 1802, the associated pad voltage VPAD rises quickly, for example, with a rise time of approximately 10 ns or less in a 2000 V human body model (HBM) ESD test event, which causes voltage breakdown within the ESD protection device 101, causing the ESD event current to conduct through the protection device 101, thereby preventing excessive current flow in the protected circuit or component 1801.

FIGS. 19-24 illustrate example corner affects in a portion of a finger shape for various implementations of the SCR ESD protection device 101 with different ratios of the distances 134 and 234. FIGS. 19-23 are sectional top views of a corner portion of various implementations of the example SCR ESD protection device 101, and which only a lower quadrant is shown. The illustrated portions in FIGS. 19-24 include a single quadrant part of the second implanted region 118, the third implanted region 120, and the first implanted region 116 along part of the straight portion 200 and the lower second turn portion 202 in one of the finger shapes F1 or F2 in FIGS. 1-4 above. FIGS. 19-23 show electric field lines in portions of the SCR ESD protection device 101 with progressively increasing ratios of the distances 234 and 134 in portions of the straight portion 200 and the lower second turn portion 202 of the finger shape F1. The simulated field lines demonstrate the advantages of elongated turn portions 201 and 202 and the effect on ESD device reliability and snap-back of turn portions and straight portions.

Figure 19:
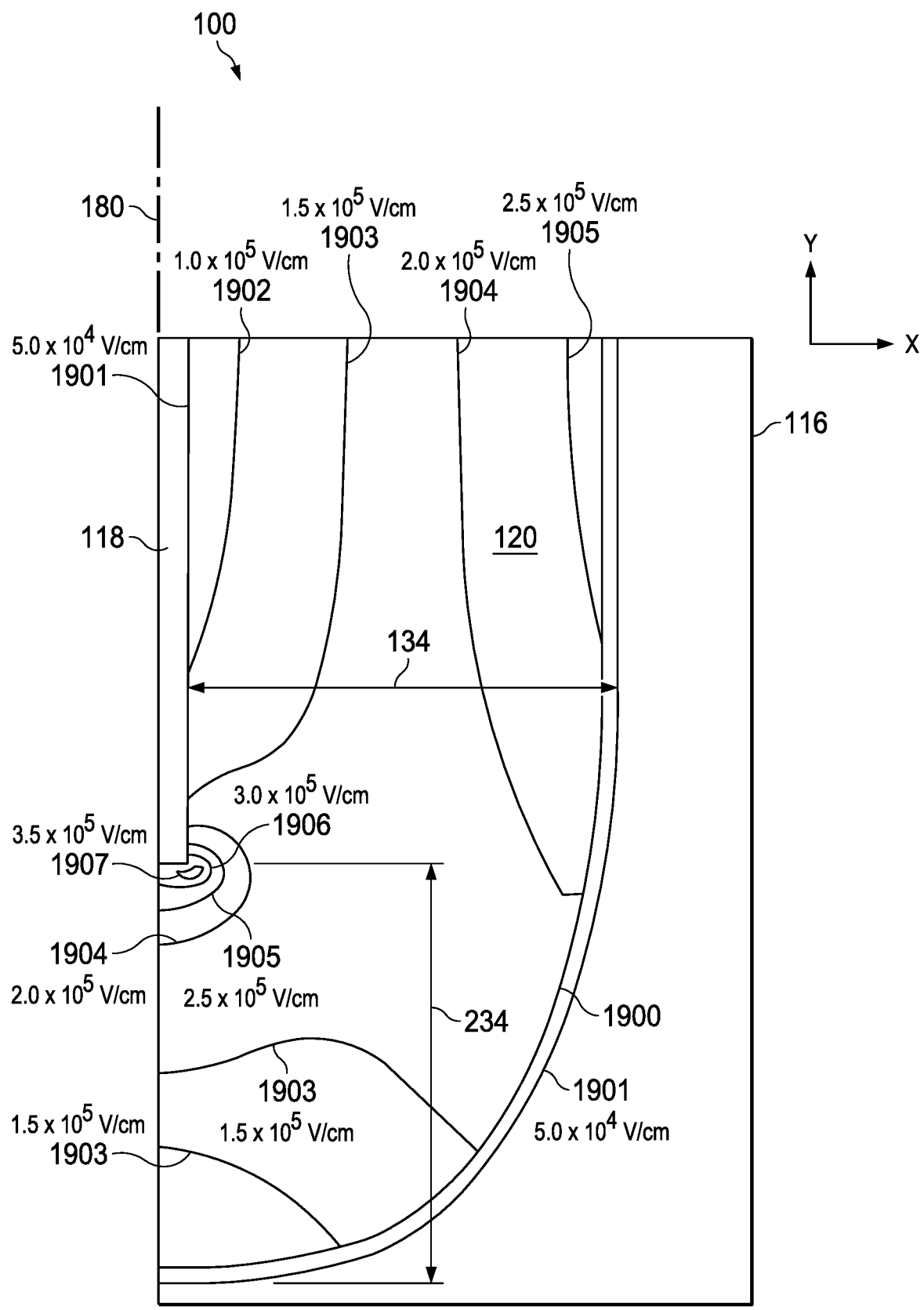
FIGS. 19-23 are partial sectional top plan views of electric field lines in a corner portion of the SCR ESD protection device of FIGS. 1-4 with progressively increasing lightly doped drain (LDD) distance ratios for straightaway and turnaround portions of the finger shapes.

FIG. 19 shows a portion of the electronic device 100 and associated simulated depletion region equipotential lines during operation. In this example, the ratio of the second distance 234 to the first distance 134 is slightly greater than unity, and the illustrated operation results in depletion along a line 1900. A first line 1901 represents an electric field magnitude of $5.0 \times 10^4$ V/cm. FIG. 19 further illustrates a second line 1902 that represents an electric field magnitude of $1.0 \times 10^5$ V/cm, as well as further lines 1903, 1904, 1905, 1906, and 1907 representing higher electric field magnitudes in the device 100. In this example, the line 1903 represents an electric field magnitude of $15 \times 10^5$ V/cm, the line 1904 represents an electric field magnitude of $2.0 \times 10^5$ V/cm, the line 1905 represents an electric field magnitude of $2.5 \times 10^5$ V/cm, the line 1906 represents an electric field magnitude of $3.0 \times 10^5$ V/cm, and the line 1907 represents an electric field magnitude of $4.5 \times 10^5$ V/cm. For the near unity ratio of the distances 234, 134 in FIG. 19, the two dimensional corner affects cause the depletion region to spread faster in the turn portion 202, leading to significant potential line crowding at the corner of the second implanted region 118.

Figure 20:
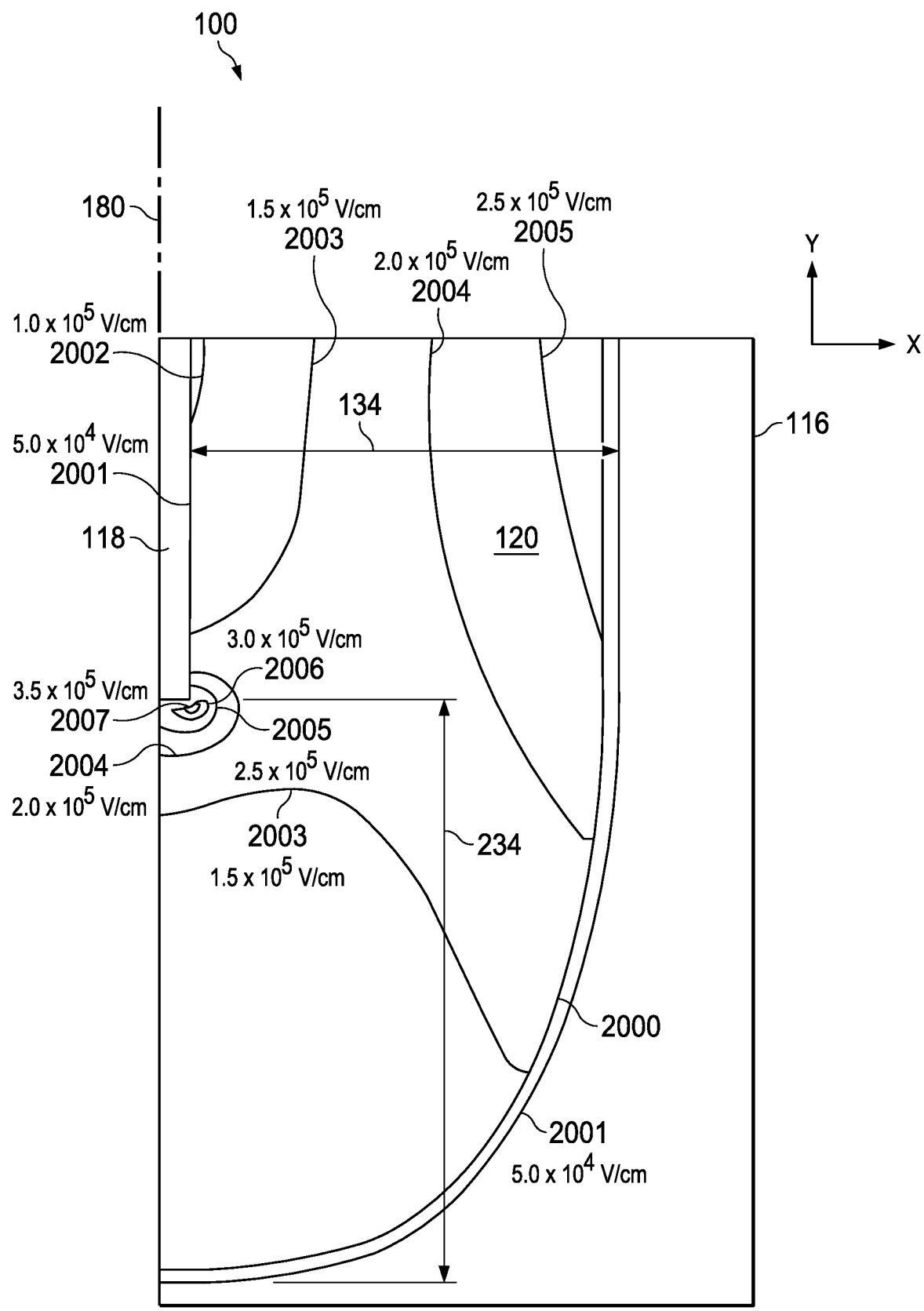

FIG. 20 illustrates a slightly elongated implementation of the device 100, with an increased distance 234 relative to the distance 134 and the associated of FIG. 19. The further elongation in the turn portion 202 in FIG. 20 provide slightly improved performance with respect to line crowding at the corner of the second implanted region 118 with a depletion line 2000, and comparative electric field magnitude lines 2001-2007. In this example, the line 2001 represents an electric field magnitude of $5.0 \times 10^4$ V/cm, the line 2002 represents an electric field magnitude of $1.0 \times 10^5$ V/cm, the line 2003 represents an electric field magnitude of $1.5 \times 10^5$ V/cm, the line 2004 represents an electric field magnitude of $2.0 \times 10^5$ V/cm, the line 2005 represents an electric field magnitude of $2.5 \times 10^5$ V/cm, the line 2006 represents an electric field magnitude of $3.0 \times 10^5$ V/cm, and the line 2007 represents an electric field magnitude of $3.5 \times 10^5$ V/cm.

Figure 21:
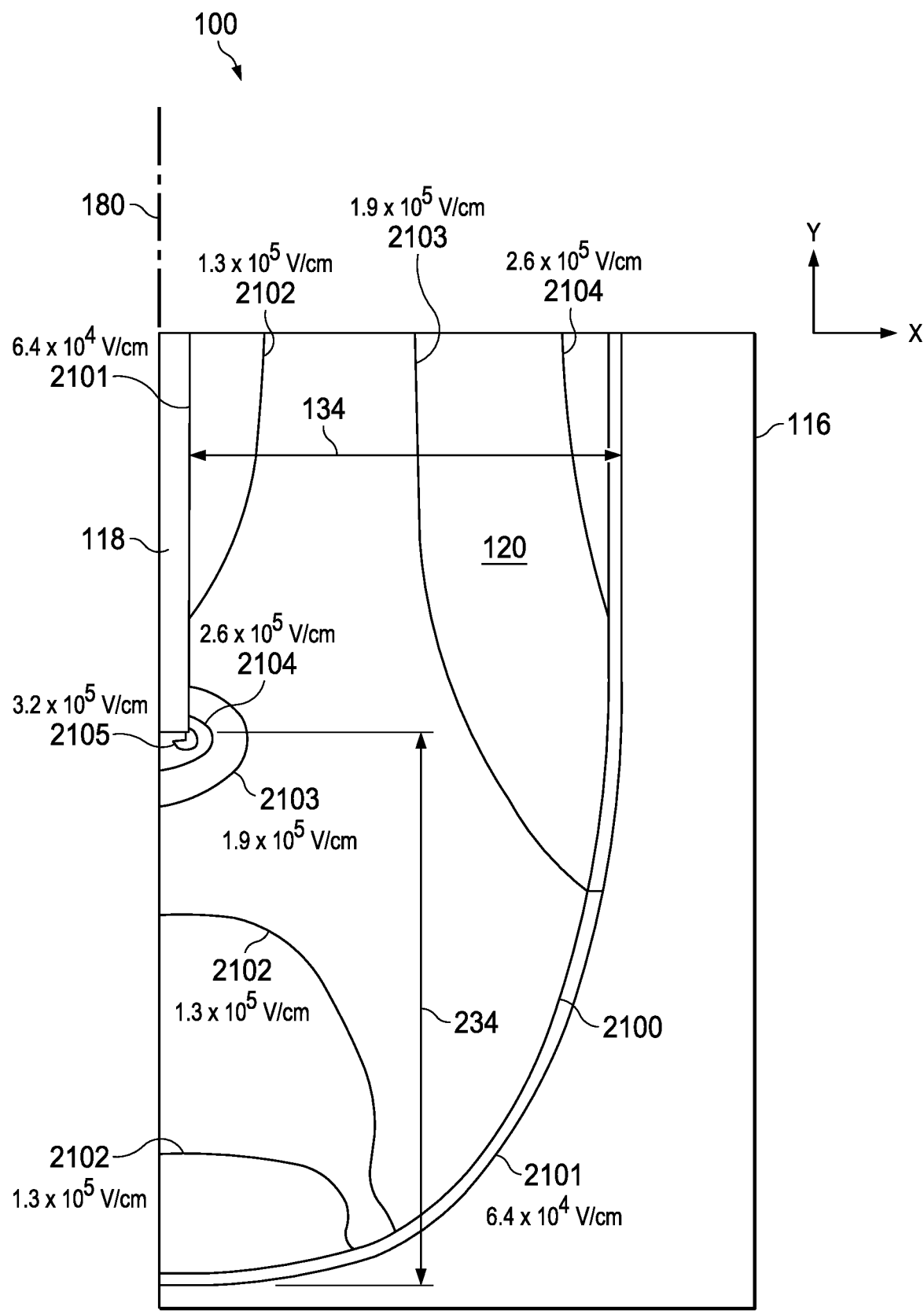
Figure 22:
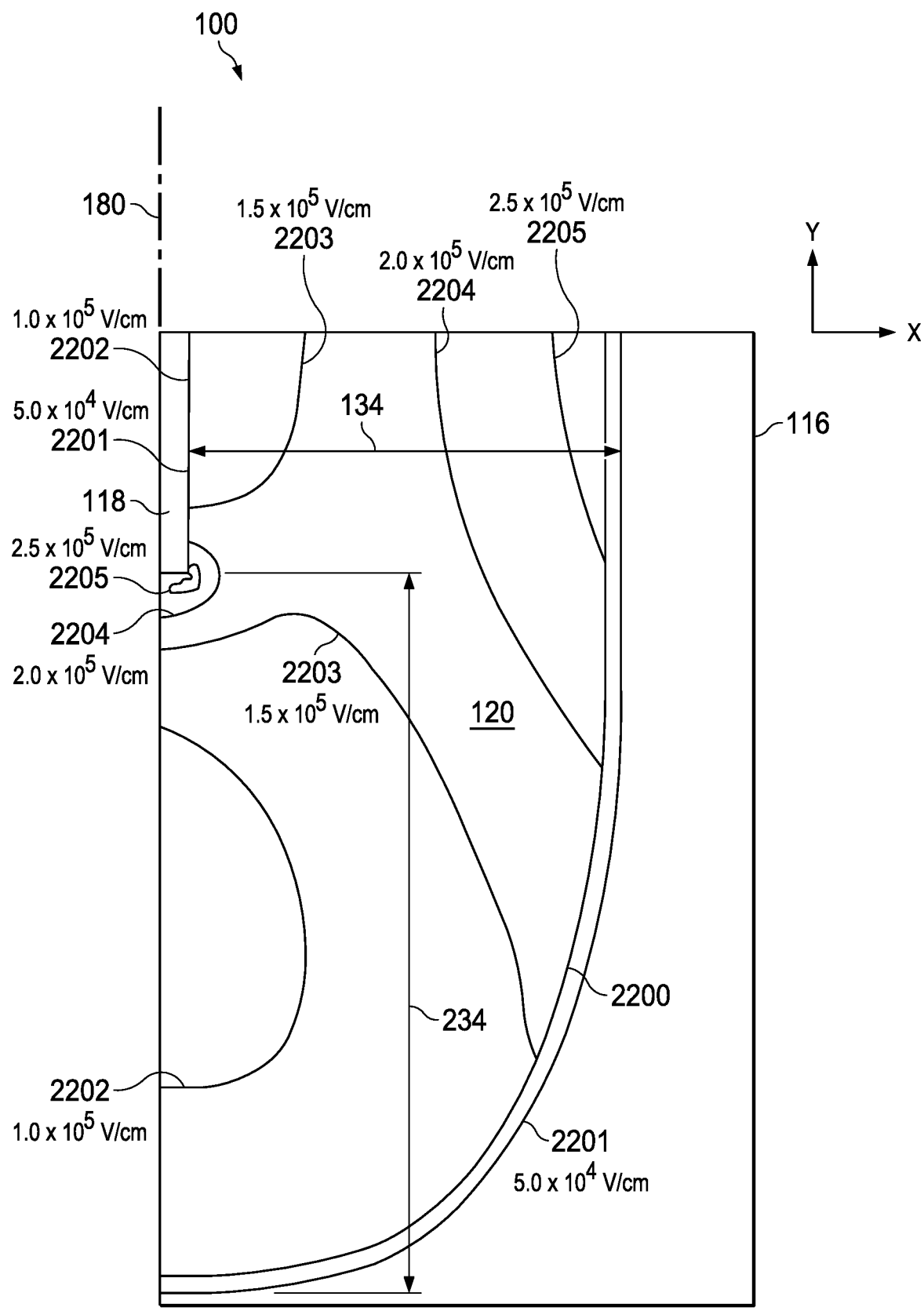
Figure 23:
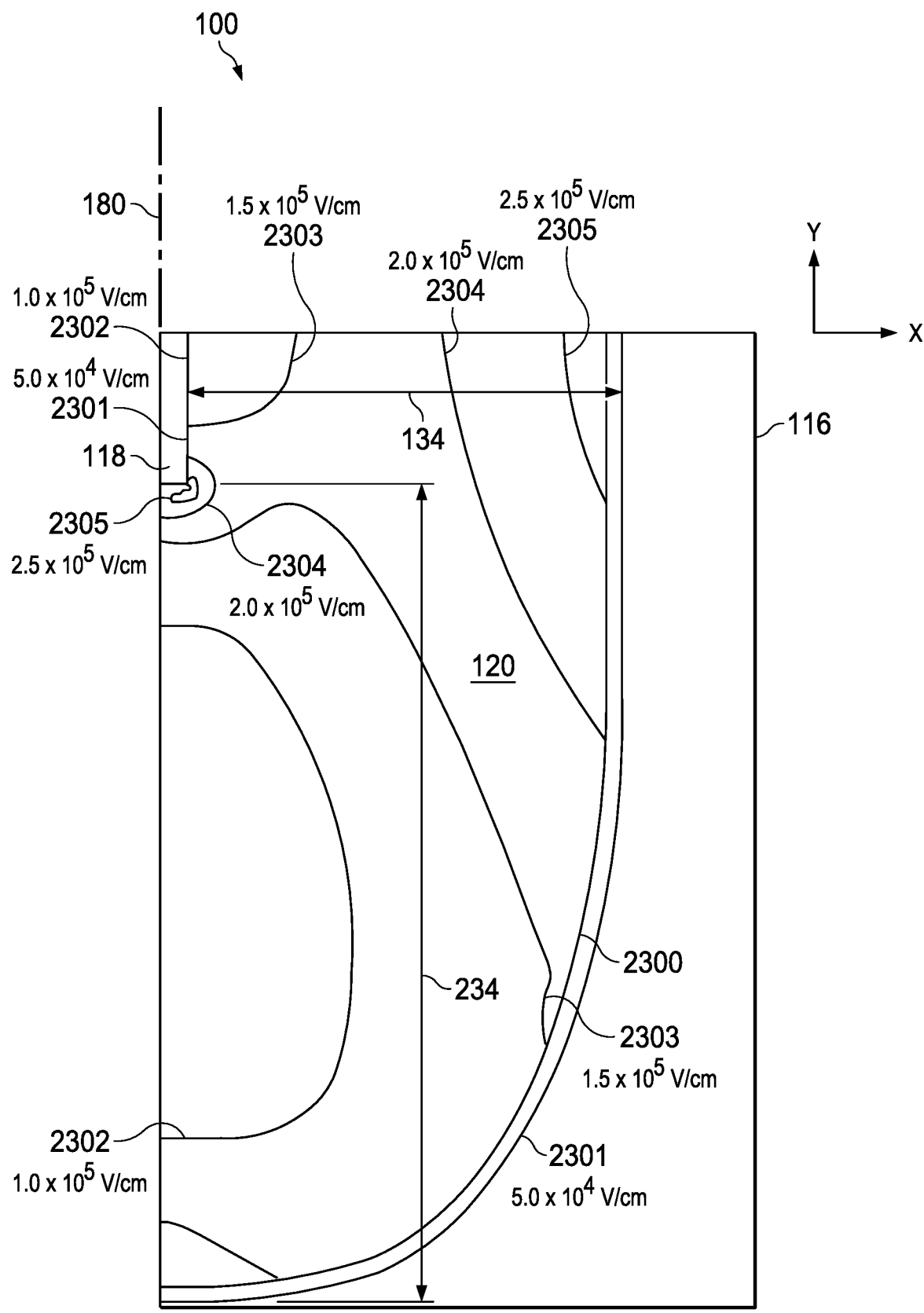

Further improvement is demonstrated in the successively further elongated examples of FIGS. 21-23. FIG. 21 shows a depletion line 2100 as well as comparative electric field magnitude lines 2101-2105 that show further improvement in the performance by an increased distance 234 relative to the distance 134 in the example of FIG. 20. In FIG. 21, the line 2101 represents an electric field magnitude of $6.4 \times 10^4$ V/cm, the line 2102 represents an electric field magnitude of $1.3 \times 10^5$ V/cm, the line 2103 represents an electric field magnitude of $1.9 \times 10^5$ V/cm, the line 2104 represents an electric field magnitude of $2.6 \times 10^5$ V/cm, and the line 2105 represents an electric field magnitude of $3.2 \times 10^5$ V/cm. FIG. 22 shows a depletion line 2200 as well as comparative electric field magnitude lines 2201-2205 that show further improvement in the performance by an increased distance 234 relative to the distance 134 in the example of FIG. 21. In the example of FIG. 22, the line 2201 represents an electric field magnitude of $5.0 \times 10^4$ V/cm, the line 2202 represents an electric field magnitude of $1.0 \times 10^5$ V/cm, the line 2203 represents an electric field magnitude of $1.5 \times 10^5$ V/cm, the line 2204 represents an electric field magnitude of $2.0 \times 10^5$ V/cm, and the line 2205 represents an electric field magnitude of $2.5 \times 10^5$ V/cm. Further improvement as shown in FIG. 23, which includes a depletion line 2300 as well as comparative electric field magnitude lines 2301-2305 that show further improvement in the performance by an increased distance 234 relative to the distance 134 in the example of FIG. 22. In this example, the line 2301 represents an electric field magnitude of $5.0 \times 10^4$ V/cm, the line 2302 represents an electric field magnitude of $1.0 \times 10^5$ V/cm, the line 2303 represents an electric field magnitude of $1.5 \times 10^5$ V/cm, the line 2304 represents an electric field magnitude of $2.0 \times 10^5$ V/cm, and the line 2305 represents an electric field magnitude of $2.5 \times 10^5$ V/cm.

Figure 24:
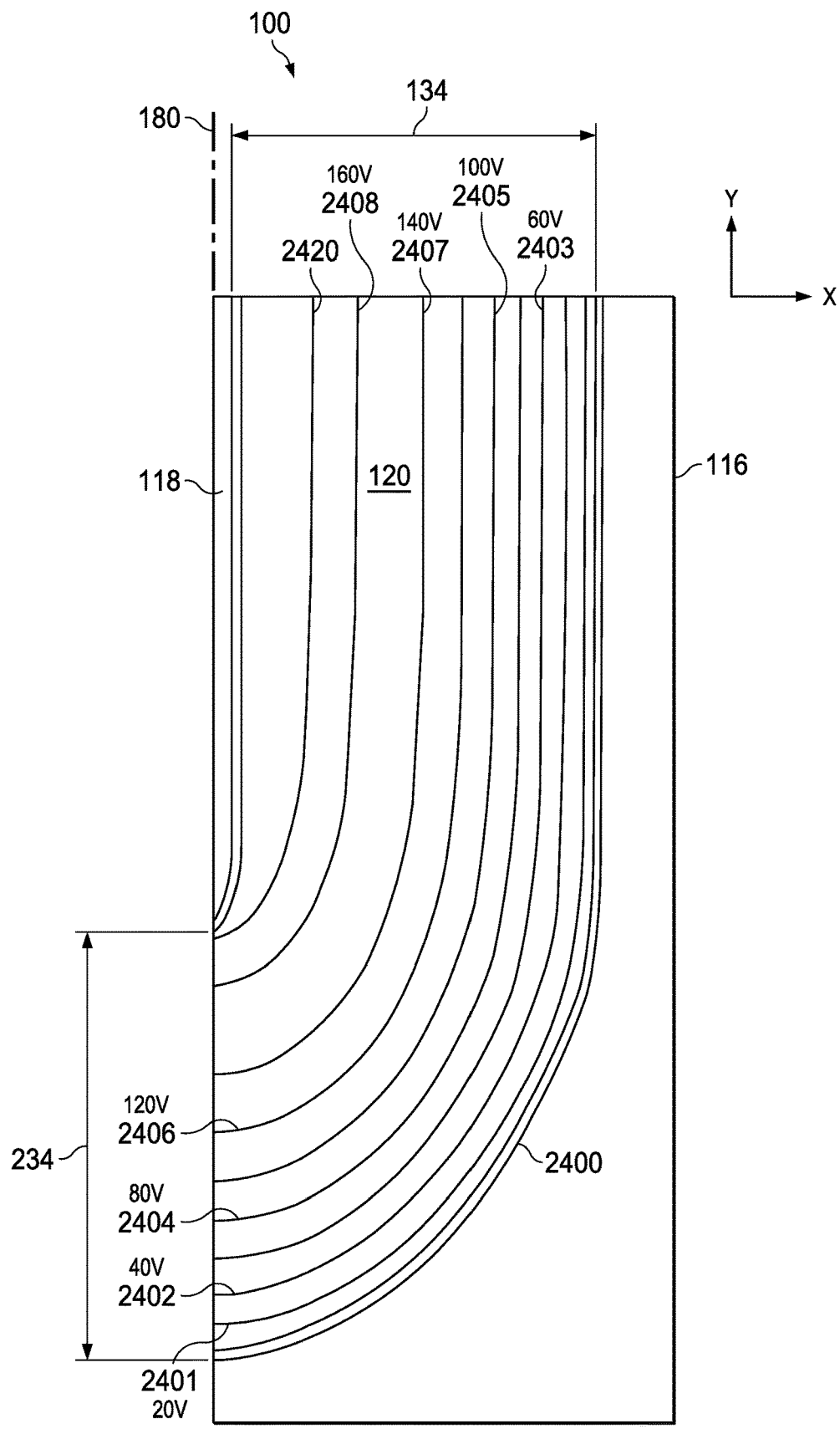
FIG. 24 is a partial sectional top plan view of electric voltage lines in a corner portion of the SCR ESD protection device of FIGS. 1-4.

FIG. 24 is a partial sectional side elevation view of electric voltage lines in a portion of the SCR ESD protection device 101 of FIGS. 1-4 for an elongated ratio of the distances 234, 134 in a quadrant of the lower turn portion 202 of the electronic device 100 with a depletion line 2400. In this example, the line 2401 shows a voltage of 20 V, the line 2402 shows a voltage of 40 V, the line 2403 represents 60 V, the line 2404 represents 80 V, the line 2405 represents 100 V, the line 2406 represents 120 V, the line 2407 represents 140 V, the line 2408 represents 160 V, and the line 2420 shows a depletion line in the device 100. The simulated results of FIGS. 19-24 show the advantages of the elongation in the turn portions to oh one and 202 of the finger shapes for the SCR ESD protection device 101, in which the respective first and second implanted regions 116 and 118 are spaced apart from one another in the straight portion 200 by the first distance 134, and are spaced apart from one another in the turn portions to oh one and 202 by the second distance 234, where the ratio of the second distance 234 to the first distance 134 is greater than unity, for example, in a range of 1.5 to 2.0.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An electronic device, comprising:
    a substrate including a semiconductor layer; and
    an electrostatic discharge (ESD) protection device, including:
        a first implanted region disposed in the semiconductor layer, the first implanted region including majority carrier dopants of a first type,
        a second implanted region disposed in the semiconductor layer and spaced apart from the first implanted region along a first direction, the second implanted region including majority carrier dopants of a second type, and
        a third implanted region disposed in the semiconductor layer, the third implanted region extending along the first direction from the first implanted region to the second implanted region, the third implanted region including majority carrier dopants of the second type;
    the first, second, and third implanted regions extending along a second direction in a straight portion of a finger shape, the second direction being orthogonal to the first direction, the second implanted region extending along a center of the finger shape; and
    the first and third implanted regions extending in a turn portion at an end of the straight portion of the finger shape.

2. The electronic device of claim 1,
    wherein the turn portion is a first turn portion and the electronic device further comprises a second turn portion;
    wherein the second implanted region is spaced apart from the first implanted region along the first direction by a first distance in the straight portion of the finger shape;
    wherein the second implanted region is spaced apart from the first implanted region along the second direction by a second distance in the first and second turn portions of the finger shape; and
    wherein a ratio of the second distance to the first distance is in a range of 1.5 to 2.0.

3. The electronic device of claim 2,
    wherein the ESD protection device includes:
        a cathode, including a first implanted portion of the first implanted region, the first implanted portion of the first implanted region including majority carrier dopants of the second type at a dopant concentration greater than a dopant concentration of a remainder of the first implanted region,
        a gate, including a second implanted portion of the first implanted region, the second implanted portion of the first implanted region including majority carrier dopants of the first type at a dopant concentration greater than a dopant concentration of the remainder of the first implanted region, and
        an anode, including an implanted portion of the second implanted region, the implanted portion of the second implanted region including majority carrier dopants of the first type at a dopant concentration greater than a dopant concentration of a remainder of the second implanted region,
    the first implanted portion of the first implanted region, the second implanted portion of the first implanted region, and the implanted portion of the second implanted region extending in the straight portion of the finger shape, and
    the first implanted portion of the first implanted region, the second implanted portion of the first implanted region, and the implanted portion of the second implanted region not extending in either of the first and second turn portions of the finger shape;
    the electronic device further comprising a metallization structure, including conductive structures that electrically connect the cathode and the gate of the ESD protection device to one another.

4. The electronic device of claim 3,
wherein the ESD protection device further includes:
an isolation layer extending in a trench in the second side of the semiconductor layer, the isolation layer extending along the first direction from the first implanted region, and
a conductive field plate disposed on part of the second side of the semiconductor layer, the conductive field plate extending along the first direction over a portion of the first implanted region, and extending past the first implanted region and over a portion of the isolation layer; and
wherein the first isolation layer and the conductive field plate extend in the straight portion and in the first and second turn portions of the finger shape.

5. The electronic device of claim 4, wherein the substrate is a silicon-on-insulator (SOI) structure, including:
a semiconductor substrate, including opposite first and second sides,
an insulator layer, including opposite first and second sides, the first side of the insulator layer disposed along the second side of the semiconductor substrate, and
the semiconductor layer, the first side of the semiconductor layer being disposed along the second side of the insulator layer.

6. The electronic device of claim 2,
wherein the ESD protection device further includes:
an isolation layer extending in a trench in the second side of the semiconductor layer, the isolation layer extending along the first direction from the first implanted region, and
a conductive field plate disposed on part of the second side of the semiconductor layer, the conductive field plate extending along the first direction over a portion of the first implanted region, and extending past the first implanted region and over a portion of the isolation layer; and
wherein the first isolation layer and the conductive field plate extend in the straight portion and in the first and second turn portions of the finger shape.

7. The electronic device of claim 2, wherein the substrate is a silicon-on-insulator (SOI) structure, including:
a semiconductor substrate, including opposite first and second sides,
an insulator layer, including opposite first and second sides, the first side of the insulator layer disposed along the second side of the semiconductor substrate, and
the semiconductor layer, the first side of the semiconductor layer being disposed along the second side of the insulator layer.

8. The electronic device of claim 1, wherein the substrate is a silicon-on-insulator (SOI) structure, including:
a semiconductor substrate, including opposite first and second sides,
an insulator layer, including opposite first and second sides, the first side of the insulator layer disposed along the second side of the semiconductor substrate, and
the semiconductor layer, the first side of the semiconductor layer being disposed along the second side of the insulator layer.

9. The electronic device of claim 1, wherein the electronic device is an integrated circuit (IC), further including a protected circuit or component connected to an externally accessible terminal or pad of the IC, wherein the ESD protection device is electrically connected to the externally accessible terminal or pad of the IC.

10. The electronic device of claim 1, wherein the ESD protection device includes a second finger shape spaced apart from the finger shape along the first direction by a non-zero distance.

11. An electronic device, comprising:
a substrate including a semiconductor layer; and
an electrostatic discharge (ESD) protection device, including:
a first implanted region disposed in the semiconductor layer, the first implanted region including majority carrier dopants of a first type,
a second implanted region disposed in the semiconductor layer and spaced apart from the first implanted region along a first direction, the second implanted region including majority carrier dopants of a second type, and
a third implanted region disposed in the semiconductor layer, the third implanted region extending along the first direction from the first implanted region to the second implanted region, the third implanted region including majority carrier dopants of the second type;
the first, second, and third implanted regions extending along a second direction in a straight portion of a finger shape, the second direction being orthogonal to the first direction, the second implanted region extending along a center of the finger shape; and
the first and third implanted regions extending in a turn portion at an end of the straight portion of the finger shape,
wherein the ESD protection device includes:
a cathode, including a first implanted portion of the first implanted region, the first implanted portion of the first implanted region including majority carrier dopants of the second type at a dopant concentration greater than a dopant concentration of a remainder of the first implanted region,
a gate, including a second implanted portion of the first implanted region, the second implanted portion of the first implanted region including majority carrier dopants of the first type at a dopant concentration greater than a dopant concentration of the remainder of the first implanted region, and
an anode, including an implanted portion of the second implanted region, the implanted portion of the second implanted region including majority carrier dopants of the first type at a dopant concentration greater than a dopant concentration of a remainder of the second implanted region,
the first implanted portion of the first implanted region, the second implanted portion of the first implanted region, and the implanted portion of the second implanted region extending in the straight portion of the finger shape, and
the first implanted portion of the first implanted region, the second implanted portion of the first implanted region, and the implanted portion of the second implanted region not extending in the turn portion of the finger shape;
the electronic device further comprising a metallization structure, including conductive structures that electrically connect the cathode and the gate of the ESD protection device to one another.

12. The electronic device of claim 11,
wherein the ESD protection device further includes:
an isolation layer extending in a trench in the second side of the semiconductor layer, the isolation layer extending along the first direction from the first implanted region, and
a conductive field plate disposed on part of the second side of the semiconductor layer, the conductive field plate extending along the first direction over a portion of the first implanted region, and extending past the first implanted region and over a portion of the isolation layer; and
wherein the first isolation layer and the conductive field plate extend in the straight portion and in the turn portion of the finger shape.

13. The electronic device of claim 12, wherein the substrate is a silicon-on-insulator (SOI) structure, including:
a semiconductor substrate, including opposite first and second sides,
an insulator layer, including opposite first and second sides, the first side of the insulator layer disposed along the second side of the semiconductor substrate, and
the semiconductor layer, the first side of the semiconductor layer being disposed along the second side of the insulator layer.

14. An electronic device, comprising:
a substrate including a semiconductor layer; and
an electrostatic discharge (ESD) protection device, including:
a first implanted region disposed in the semiconductor layer, the first implanted region including majority carrier dopants of a first type,
a second implanted region disposed in the semiconductor layer and spaced apart from the first implanted region along a first direction, the second implanted region including majority carrier dopants of a second type, and
a third implanted region disposed in the semiconductor layer, the third implanted region extending along the first direction from the first implanted region to the second implanted region, the third implanted region including majority carrier dopants of the second type;
the first, second, and third implanted regions extending along a second direction in a straight portion of a finger shape, the second direction being orthogonal to the first direction, the second implanted region extending along a center of the finger shape; and
the first and third implanted regions extending in a turn portion at an end of the straight portion of the finger shape,
wherein the ESD protection device further includes:
an isolation layer extending in a trench in the second side of the semiconductor layer, the isolation layer extending along the first direction from the first implanted region, and
a conductive field plate disposed on part of the second side of the semiconductor layer, the conductive field plate extending along the first direction over a portion of the first implanted region, and extending past the first implanted region and over a portion of the isolation layer; and
wherein the first isolation layer and the conductive field plate extend in the straight portion and in the turn portion of the finger shape.

15. An electronic device, comprising:
a silicon-on-insulator (SOI) structure, including:
a semiconductor substrate, including opposite first and second sides,
an insulator layer, including opposite first and second sides, the first side of the insulator layer disposed along the second side of the semiconductor substrate, and
a semiconductor layer with opposite first and second sides, the first side of the semiconductor layer being disposed along the second side of the insulator layer; and
an electrostatic discharge (ESD) protection device, including:
a first implanted region disposed along a first portion of the second side of the semiconductor layer, the first implanted region including majority carrier dopants of a first type,
a second implanted region disposed along a second portion of the second side of the semiconductor layer and spaced apart from the first implanted region along the first direction, the second implanted region including majority carrier dopants of a second type, and
a third implanted region disposed along a third portion of the second side of the semiconductor layer, the third implanted region extending along the first direction from the first implanted region to the second implanted region, the third implanted region including majority carrier dopants of the second type;
the first, second, and third implanted regions extending along a second direction in a straight portion of a finger shape, the second direction being orthogonal to the first direction, the second implanted region extending along a center of the finger shape;
the first and third implanted regions extending in first and second turn portions at respective opposite first and second ends of the straight portion of the finger shape;
the second implanted region being spaced apart from the first implanted region along the first direction by a first distance in the straight portion of the finger shape; and
the second implanted region being spaced apart from the first implanted region along the second direction by a second distance in the first and second turn portions of the finger shape, the second distance being 1.5 to 2.0 times the first distance.

16. The electronic device of claim 15,
wherein the ESD protection device includes:
a first implanted portion of the first implanted region, the first implanted portion of the first implanted region including majority carrier dopants of the second type at a dopant concentration greater than a dopant concentration of a remainder of the first implanted region,
a second implanted portion of the first implanted region, the second implanted portion of the first implanted region including majority carrier dopants of the first type at a dopant concentration greater than a dopant concentration of the remainder of the first implanted region, and
an implanted portion of the second implanted region, the implanted portion of the second implanted region including majority carrier dopants of the first type at a dopant concentration greater than a dopant concentration of a remainder of the second implanted region,
the first implanted portion of the first implanted region, the second implanted portion of the first implanted region, and the implanted portion of the second implanted region extending in the straight portion of the finger shape, and the first implanted portion of the first implanted region, the second implanted portion of the first implanted region, and the implanted portion of the second implanted region not extending in either of the first and second turn portions of the finger shape.

17. The electronic device of claim 15,
wherein the ESD protection device further includes:
    an isolation layer extending in a trench in the second side of the semiconductor layer, the isolation layer extending along the first direction from the first implanted region, and
    a conductive field plate disposed on part of the second side of the semiconductor layer, the conductive field plate extending along the first direction over a portion of the first implanted region, and extending past the first implanted region and over a portion of the isolation layer; and
wherein the first isolation layer and the conductive field plate extend in the straight portion and in the first and second turn portions of the finger shape.

18. The electronic device of claim 15, wherein the electronic device is an integrated circuit (IC), further including a protected circuit or component connected to an externally accessible terminal or pad of the IC, wherein the ESD protection device is electrically connected to the externally accessible terminal or pad of the IC.

19. An electronic device, comprising:
    a silicon-on-insulator (SOI) structure, including a semiconductor layer; and
    a silicon controlled rectifier (SCR), including:
        a first implanted region disposed along a first portion of the semiconductor layer, the first implanted region including majority carrier dopants of a first type,
        a cathode, including a first implanted portion of the first implanted region, the first implanted portion of the first implanted region including majority carrier dopants of a second type at a dopant concentration greater than a dopant concentration of a remainder of the first implanted region,
        a gate, including a second implanted portion of the first implanted region, the second implanted portion of the first implanted region including majority carrier dopants of the first type at a dopant concentration greater than the dopant concentration of the remainder of the first implanted region,
        a second implanted region disposed along a second portion of the semiconductor layer and spaced apart from the first implanted region along the first direction, the second implanted region including majority carrier dopants of the second type,
        an anode, including an implanted portion of the second implanted region, the implanted portion of the second implanted region including majority carrier dopants of the first type at a dopant concentration greater than a dopant concentration of a remainder of the second implanted region, and
        a third implanted region disposed along a third portion of the semiconductor layer, the third implanted region extending along the first direction from the first implanted region to the second implanted region, the third implanted region including majority carrier dopants of the second type;
    the first, second, and third implanted regions extending along a second direction in a straight portion of a finger shape, the second direction being orthogonal to the first direction, the second implanted region extending along a center of the finger shape;
    the first and third implanted regions extending in first and second turn portions at respective opposite first and second ends of the straight portion of the finger shape;
    the first implanted portion of the first implanted region, the second implanted portion of the first implanted region, and the implanted portion of the second implanted region extending in the straight portion of the finger shape; and
    the first implanted portion of the first implanted region, the second implanted portion of the first implanted region, and the implanted portion of the second implanted region not extending in either of the first and second turn portions of the finger shape.

20. The electronic device of claim 19,
wherein the second implanted region is spaced apart from the first implanted region along the first direction by a first distance in the straight portion of the finger shape; and
wherein the second implanted region is spaced apart from the first implanted region along the second direction by a second distance in the first and second turn portions of the finger shape, the second distance being 1.5 to 2.0 times the first distance.

* * * * *